(12) United States Patent
Yokoyama et al.

(10) Patent No.: US 10,897,248 B2
(45) Date of Patent: Jan. 19, 2021

(54) SEMICONDUCTOR DEVICE

(71) Applicant: RENESAS ELECTRONICS CORPORATION, Tokyo (JP)

(72) Inventors: Yoshisato Yokoyama, Tokyo (JP); Toshiaki Sano, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/286,428

(22) Filed: Feb. 26, 2019

(65) Prior Publication Data

US 2019/0296734 A1  Sep. 26, 2019

(30) Foreign Application Priority Data

Mar. 23, 2018  (JP) ................ 2018-056228

(51) Int. Cl.
| | |
|---|---|
| G11C 11/412 | (2006.01) |
| H03K 17/14 | (2006.01) |
| G11C 11/418 | (2006.01) |
| H03K 17/284 | (2006.01) |
| G11C 11/419 | (2006.01) |

(52) U.S. Cl.
CPC .......... *H03K 17/145* (2013.01); *G11C 11/412* (2013.01); *G11C 11/418* (2013.01); *G11C 11/419* (2013.01); *H03K 17/284* (2013.01)

(58) Field of Classification Search
CPC ............................ H03K 17/145; G11C 11/412

USPC ................................................ 365/156
See application file for complete search history.

(56) References Cited

U.S. PATENT DOCUMENTS

| | | | |
|---|---|---|---|
| 6,222,752 B1* | 4/2001 | Kumar ............... | G06F 12/0862 365/189.07 |
| 6,535,439 B2* | 3/2003 | Cowles ............... | G11C 11/4074 365/200 |
| 9,391,606 B2 | 7/2016 | Fukuo et al. | |
| 2002/0131293 A1* | 9/2002 | Hong .................. | G11C 7/065 365/149 |
| 2009/0122630 A1* | 5/2009 | Takahashi ........... | G11C 7/065 365/207 |

FOREIGN PATENT DOCUMENTS

JP    2015-079916 A    4/2015

\* cited by examiner

*Primary Examiner* — Amir Zarabian
*Assistant Examiner* — Muna A Techane
(74) *Attorney, Agent, or Firm* — McDermott Will & Emery LLP

(57) ABSTRACT

A MOS transistor is allowed to recover from BTI degradation even when an operation mode signal is inactive. A semiconductor device includes a drive circuit coupled to a controlled circuit via a delay element. The drive circuit includes first and second MOS transistors coupled in series to each other. The first MOS transistor is controlled to be in an OFF state when the operation mode signal is active. When the operation mode signal is inactive, the first MOS transistor is controlled to be in the OFF state at least temporarily while the second MOS transistor is controlled to be in the OFF.

9 Claims, 15 Drawing Sheets

SEMICONDUCTOR DEVICE

CROSS-REFERENCE TO RELATED APPLICATIONS

The disclosure of Japanese Patent Application No. 2018-056228 filed on Mar. 23, 2018 including the specification, drawings and abstract is incorporated herein by reference in its entirety.

BACKGROUND

The present disclosure relates to a semiconductor device and is used to inhibit a MOS (Metal Oxide Semiconductor) transistor from being degraded by BTI (Bias Temperature Instability).

BTI is among degradation modes of MOS transistors. The BTI is the degradation mode in which, when a MOS transistor stays in an ON state for a long time, the threshold voltage thereof gradually increases. The BTI occurs either in an NMOS (N-channel MOS) transistor or in a PMOS (P-channel MOS) transistor. The BTI in the NMOS transistor is referred to as PBTI (Positive BTI), while the BTI in the PMOS transistor is referred to as NBTI (Negative BTI).

It is known that the BTI involves a recovery phenomenon in which, when the gate voltage is turned OFF, the increased threshold voltage returns to an original level. Japanese Unexamined Patent Application Publication No. 2015-079916 (Patent Document 1) discloses a technique which uses this recovery phenomenon to allow a MOS transistor to recover from BTI degradation. Specifically, according to this document, immediately before a MOS transistor in a standby state starts an AC operation, a reset pulse for recovery from the degradation is input to the gate of the MOS transistor.

RELATED ART DOCUMENT

Patent Document

[Patent Document 1] Japanese Unexamined Patent Application Publication No. 2015-079916

SUMMARY

In most cases, in a semiconductor device, a switch MOS transistor which is switched between an ON state and an OFF state depending on an operation mode is provided. For example, in a test mode before product shipment, the switch MOS transistor is controlled into the OFF state while, in a non-test mode after product shipment, the switch MOS transistor is controlled into the ON state. In this case, since the semiconductor device after shipment is mostly used in the non-test mode, it is impossible to adopt such a means for recovery from BTI degradation as described in Japanese Unexamined Patent Application Publication No. 2015-079916, i.e., a means which applies a reset pulse to the gate of the MOS transistor when the operation mode is switched.

Other problems and novel features of the present invention will become apparent from a statement in the present specification and the accompanying drawings.

A semiconductor device in accordance with an aspect includes a drive circuit coupled to a controlled circuit via a delay element. The drive circuit includes first and second MOS transistors coupled in series to each other. The first MOS transistor is controlled to be in an OFF state when an operation mode signal is active. When the operation mode signal is inactive, the first MOS transistor is controlled to be in the OFF state at least temporarily while the second MOS transistor is controlled to be in the OFF state.

According to the aspect described above, the first MOS transistor can be recovered from BTI degradation even when the operation mode signal is inactive.

DETAILED DESCRIPTION

Figure 1:
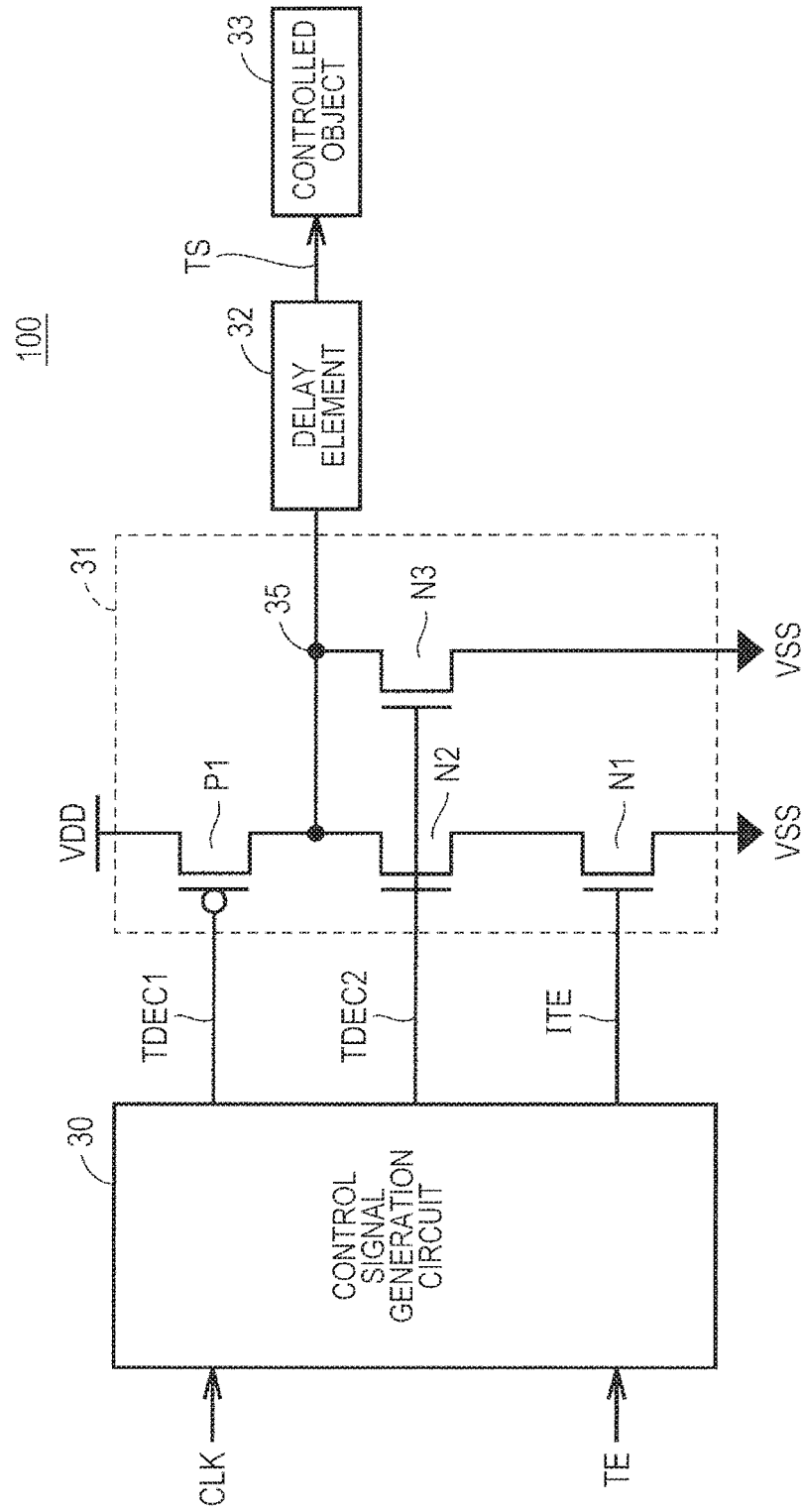
FIG. 1 is a block diagram showing a configuration of a portion of a semiconductor device according to a first embodiment.

The following will describe each of the embodiments of the present invention in detail with reference to the drawings. Note that like or equivalent parts are given like reference numerals and the description thereof will not be repeated.

First Embodiment

[Configuration of Semiconductor Device]

FIG. 1 is a block diagram showing a configuration of a portion of a semiconductor device according to a first embodiment.

FIG. 1 shows a configuration of the portion of a semiconductor device 100 which generates a timing signal TS to be output to a controlled object 33. The controlled object 33 is switched between an operating state and a non-operating state depending on the logic level of the timing signal TS.

Specifically, the semiconductor device 100 includes a delay element 32, a drive circuit 31 which drives the delay element 32, and a control signal generation circuit 30 which generates a gate control signal to be output to the drive circuit 31.

The delay element 32 is, e.g., a delay line or a capacitive element.

The drive circuit 31 responds to control signals TDEC1, TDEC2, and ITE input thereto from the control signal generation circuit 30 to drive a voltage at the input terminal of the delay element 32 to a power supply voltage VDD or a ground voltage VSS. From the output terminal of the delay element 32, the timing signal TS is output to the controlled object 33.

Specifically, the drive circuit 31 includes an output node 35 coupled to the input terminal of the delay element 32, at least one PMOS (P-channel Metal Oxide Semiconductor) transistor P1, and a plurality of NMOS (N-channel MOS) transistors N1, N2, and N3. In FIG. 1, the one PMOS transistor P1 and the three NMOS transistors N1, N2, and N3 are shown as representatives, but a larger number of transistors may also be provided.

In the case of FIG. 1, the PMOS transistor P1 is coupled between a node (hereinafter referred to as the VDD power supply node) to which the power supply voltage VDD is given and the output node 35. The NMOS transistors N1 and N2 are coupled in series between a power supply node (hereinafter referred to as the VSS power supply node) to which the ground voltage VSS is given and the output node 35. The NMOS transistor N3 is coupled between the output node 35 and the VSS power supply node to be in parallel with the current path in which the NMOS transistors N1 and N2 are provided.

The NMOS transistor N1 is used as a mode selection switch which is controlled to be in an OFF state during a test mode period. The test mode is referred to also as a timing adjustment mode. Conventionally, the NMOS transistor N1 has been controlled to be in an ON state during a normal state (referred to as a user mode) period other than the test mode period. However, in the case of the present embodiment, for recovery from PBTI degradation, the NMOS transistor N1 is controlled to be in the OFF state on the basis of a clock signal CLK in a time slot in which the control of the timing signal TS is unaffected.

During the test mode period, the current path in which the NMOS transistor N1 intervenes is cut off so that an amount of current flowing from the output node 35 to the VSS power supply node decreases. In other words, the driving ability of the drive circuit 31 deteriorates. Consequently, the delay time of the timing signal TS increases. Conversely, during the user mode period, the current path in which the NMOS transistor N1 intervenes is not cut off, and accordingly the amount of current flowing from the output node 35 to the VSS power supply node can be increased compared to that during the test mode period. As a result, the delay time of the timing signal TS can be reduced compared to that during the test mode period.

The control signal generation circuit 30 generates the control signals TDEC1, TDEC2, and ITE on the basis of the clock signal CLK and a test mode signal TE. The control signal TDEC1 is used to control the gate voltage of the PMOS transistor P1. The control signal TDEC2 is used to control the gate voltages of the NMOS transistors N2 and N3. The control signal ITE is used to control the gate voltage of the NMOS transistor N1.

When the control signal TDEC1 is in an active state, the PMOS transistor P1 is in the ON state while, when the control signal TDEC1 is in an inactive state, the PMOS transistor P1 is in the OFF state. When the control signal TDEC2 is in the active state, the NMOS transistors N2 and N3 are in the ON state while, when the control signal TDEC2 is in the inactive state, the NMOS transistors N2 and N3 are in the OFF state. When the control signal ITE is in the active state, the NMOS transistor N1 is in the ON state while, when the control signal ITE is in the inactive state, the NMOS transistor N1 is in the OFF state.

[Operation of Control Signal Generation Circuit]

Figure 2:
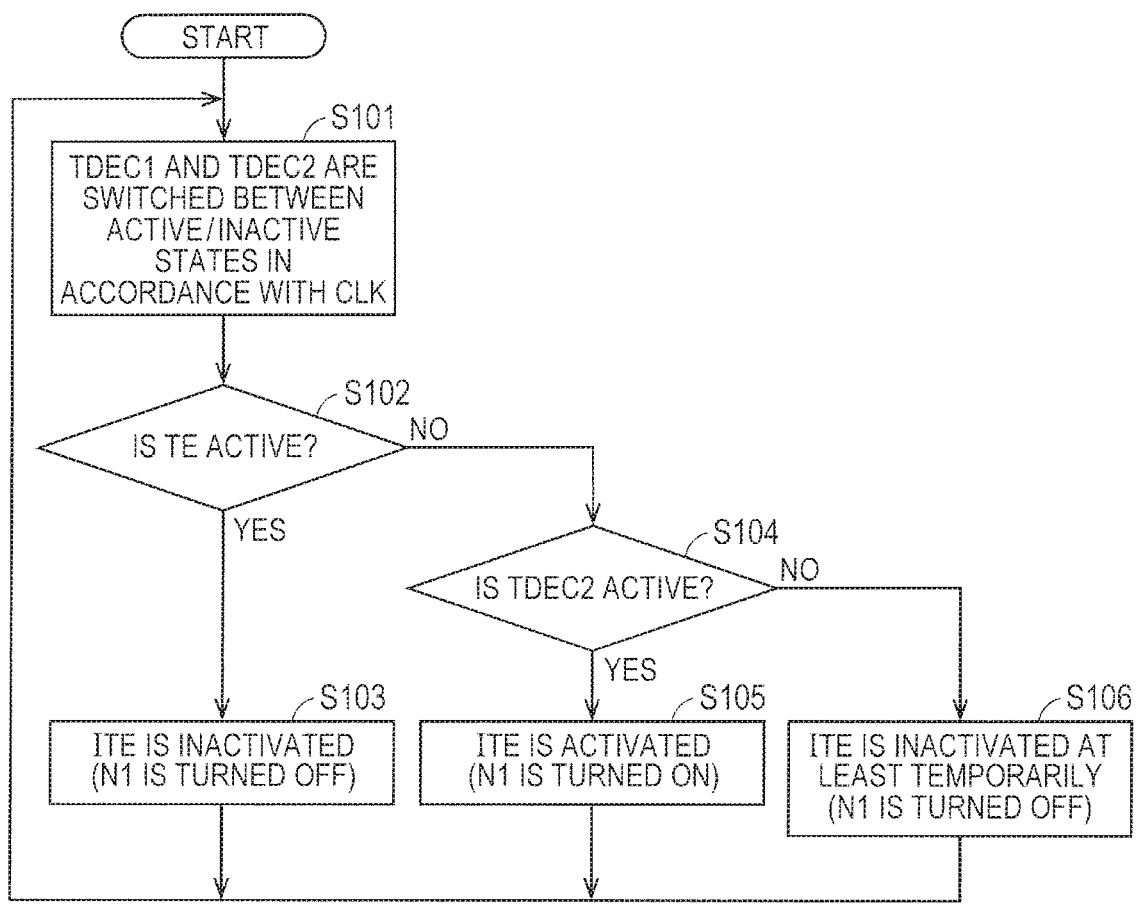
FIG. 2 is a flow chart showing an operation of a control signal generation circuit in FIG. 1.

FIG. 2 is a flow chart showing the operation of the control signal generation circuit in FIG. 1. Note that the control signal generation circuit 30 may be configured to include a logic circuit, configured on the basis of a computer, or configured to include a PLD (Programmable Logic Device) such as an FPGA (Field Programmable Gate Array). In short, the specific configuration of the control signal generation circuit 30 is not particularly limited.

In the following description, a state where a signal is active is referred to also as a state where the signal is asserted, while a state where a signal is inactive is referred to also as a state where the signal is negated.

First, the control signal generation circuit 30 switches one of the control signals TDEC1 and TDEC2 into the active state and switches the other of the control signals TDEC1 and TDEC2 into the inactive state in accordance with the clock signal CLK irrespective of whether the operation mode is the test mode or the user mode (S101). The control signals TDEC1 and TDEC2 may be the same control signal TDEC. For example, when the control signal TDEC is in the active state, the PMOS transistor P1 is in the OFF state, while the NMOS transistors N2 and N3 are in the ON state.

When the test mode signal TE is active, i.e., when the operation mode is the test mode (YES in S102), the control signal generation circuit 30 brings the control signal ITE into a normally inactive state (S103). As a result, the current path in which the NMOS transistors N1 and N2 intervene is constantly cut off. Consequently, the path in which a current flows in the drive circuit 31 is switched to the current path in which the PMOS transistor P1 intervenes and the current path in which the NMOS transistor N3 intervenes. This reduces the driving ability of the drive circuit 31, and accordingly a signal delay time in the delay element 32 increases to be able to increase an operation margin.

On the other hand, when the test mode signal TE is inactive, i.e., when the operation mode is the user mode (NO in S102), the control signal generation circuit 30 switches the control signal ITE into the active or inactive state in accordance with the control signal TDEC2.

Specifically, the control signal generation circuit 30 activates the control signal ITE when the current operation mode is the user mode (NO in S102) and the control signal TDEC2 is active (YES in S104) (S105). As a result, the current path in which the NMOS transistors N1 and N2 intervene is not cut off. Consequently, a current flows from the output node 35 to the VSS power supply node via both of the current path in which the NMOS transistors N1 and N2 intervene and the current in which the NMOS transistor N3 intervenes.

When the operation mode is the user mode (NO in S102) and the control signal TDEC2 is inactive (NO in S104), the NMOS transistors N2 and N3 are controlled to be in the OFF state so that a current flows via the PMOS transistor P1 in the ON state. In this case, the control signal generation circuit 30 controls the NMOS transistor N1 such that the NMOS transistor N1 is in the OFF state at least temporarily by at least temporarily inactivating the control signal ITE (S106). Since the NMOS transistors N2 and N3 are in the OFF state, even when the NMOS transistor N1 is controlled to be in the OFF state, the operation of the drive circuit 31 is not interrupted.

Effects of First Embodiment

Thus, in the first embodiment, the description has been given of the case where the drive circuit 31 which drives the delay element 32 includes the NMOS transistor N1 used as the mode selection switch. For example, the NMOS transistor N1 is controlled to be in the OFF state during the test mode period before product shipment and is controlled to be in a normally ON state during the user mode period after product shipment. Consequently, the NMOS transistor N1 is likely to incur PBTI degradation. When degradation, i.e., an increased threshold current occurs in the NMOS transistor N1, the delay time of the timing signal TS increases, which is undesirable in terms of circuit operation.

To solve this problem, in the semiconductor device 100 in FIG. 1, when the control signal TDEC2 output from the control signal generation circuit 30 to the gates of the NMOS transistors N2 and N3 of the drive circuit 31 is inactive, i.e., when the NMOS transistors N2 and N3 are in the OFF state, the NMOS transistor N1 is controlled to be in the OFF state at least temporarily. This allows the NMOS transistor N1 to recover from PBTI degradation without affecting the operation of the drive circuit 31.

The description has been given above of the case where the mode selection switch is formed of the NMOS transistor. However, the same control can be performed even when the mode selection switch is formed of a PMOS transistor. In this case, at least one PMOS transistor for driving the delay element 32 is provided in series to the mode selection PMOS transistor, and at least one PMOS transistor for driving the delay element 32 is also provided in parallel with the current path of these transistors.

Second Embodiment

In a second embodiment, using a memory circuit as an example, a description will be given of the case where the controlled object 33 described using FIG. 1 in the first embodiment corresponds to a sense amplifier SA. As will be described below in detail, a timing signal for operating the sense amplifier SA is supplied via a delay line 80 provided in a timing replica 51. In the drive circuit 31 which drives the delay line 80, the NMOS transistor N1 as the test mode selection switch is provided.

The following description is given using an SRAM (Static Random Access Memory) circuit as an example of the memory circuit, but the following control method is also applicable to a memory circuit other than the SRAM.

[Configuration of SRAM Circuit]

Figure 3:
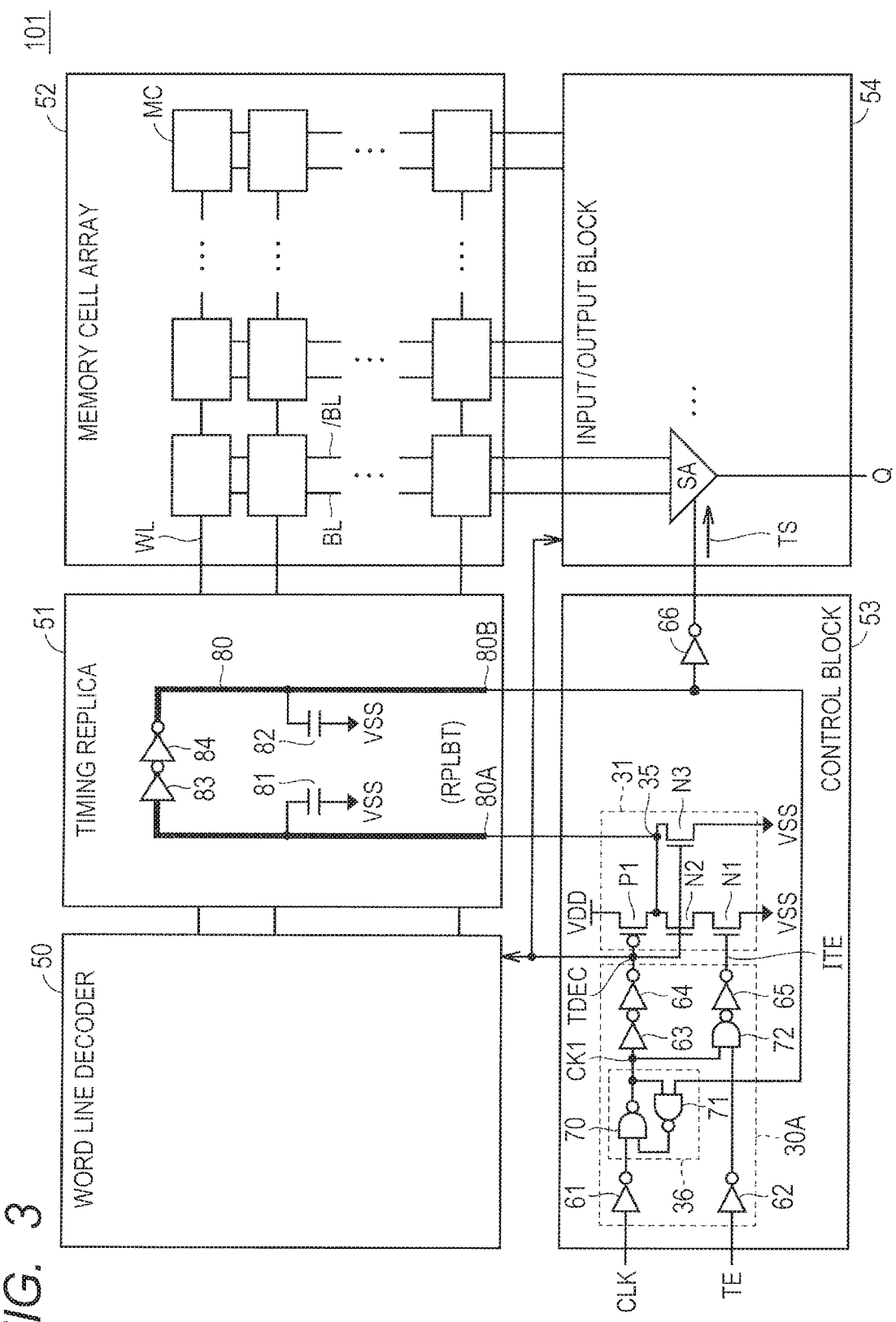
FIG. 3 is a block diagram showing a portion of a configuration of an SRAM circuit as a semiconductor device according to a second embodiment.

FIG. 3 is a block diagram showing a portion of a configuration of the SRAM circuit as a semiconductor device according to the second embodiment. FIG. 3 also shows an example of a more detailed circuit diagram of a control block 53.

Referring to FIG. 3, a semiconductor device 101 includes a memory cell array 52, a word line decoder 50, the input/output block 54, the timing replica 51, and the control block 53.

(Memory Cell Array)

The memory cell array 52 includes a plurality of memory cells MC arranged in rows and columns, a plurality of word lines WL each provided individually for the plurality of memory cells MC in the corresponding one of the rows and extending in a row direction, and a plurality of bit line pairs BL and /BL each provided individually for the plurality of memory cells MC in the corresponding one of the columns of and extending in a column direction.

(Memory Cell)

Figure 4:
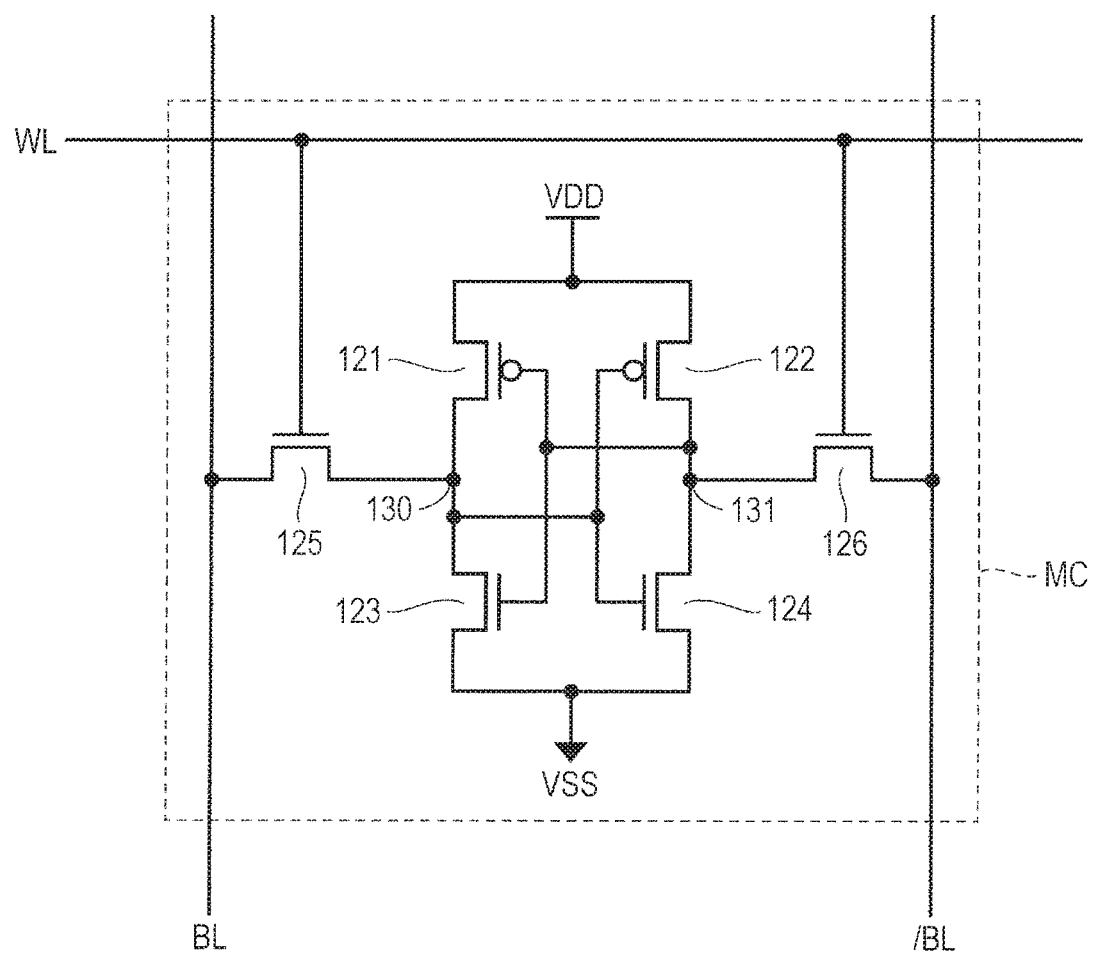
FIG. 4 is a circuit diagram showing an example of a configuration of a memory cell in FIG. 3.

FIG. 4 is a circuit diagram showing an example of a configuration of each of the memory cells in FIG. 3. Referring to FIG. 3, each of the memory cells MC includes storage nodes 130 and 131, driver PMOS transistors 121 and 122, driver NMOS transistors 123 and 124, and access NMOS transistors 125 and 126.

The storage nodes 130 and 131 retain complementary data sets one of which is on a HIGH level (H level) and the other of which is on a LOW level (L level).

The driver PMOS transistor 121 is coupled between the VDD power supply node and the one storage node 130. The driver PMOS transistor 122 is coupled between the VDD power supply node and the other storage node 131. The driver NMOS transistor 123 is coupled between the VSS power supply node and the storage node 130. The driver NMOS transistor 124 is coupled between the VSS power supply node and the storage node 131. The respective gates of the driver PMOS transistor 121 and the driver NMOS transistor 123 are coupled to the storage node 131. The respective gates of the driver PMOS transistor 122 and the driver NMOS transistor 124 are coupled to the storage node 130. By thus being coupled, the MOS transistors 121 to 124 are included in a latch circuit.

The access NMOS transistor 125 is coupled between the storage node 130 and the bit line BL. The access NMOS transistor 126 is coupled between the storage node 131 and the bit line /BL. The respective gates of the access NMOS transistors 125 and 126 are coupled to the corresponding word line WL. Due to the configuration described above, when a selection signal for the corresponding word line WL is activated, potentials in the bit line pair are changed in accordance with the complementary data sets stored in the storage nodes 130 and 131. The potential changes in the bit line pair BL and /BL are detected by the sense amplifier SA.

(Word Line Decoder)

Referring again to FIG. 3, the word line decoder 50 decodes the address signal input thereto and outputs a selection signal to the word line WL for the row corresponding to the memory cell MC to which a read or write operation is to be performed on the basis of the decoding result.

(Input/Output Block)

The input/output block 54 includes the plurality of sense amplifiers SA individually corresponding to the plurality of columns in the memory cell array 52. Each of the sense amplifiers SA starts to amplify voltages on the corresponding bit line pair BL and /BL when the timing signal TS input thereto from the control block 53 is activated. Then, each of the sense amplifiers SA outputs the result Q of detecting data stored in the memory cell MC which is coupled to the corresponding bit line pair BL and /BL and to which a read operation is to be performed.

Note that, in FIG. 3, in correspondence to each of the columns in the memory cell array 52, the sense amplifier SA is provided. However, unlike in this configuration, the input/output block 54 may also be configured to include a column selection circuit and at least one sense amplifier SA. In this case, the data stored in the memory cells MC in the column selected on the basis of a read address is detected by the sense amplifier SA.

(Timing Replica)

The timing replica 51 includes the delay line 80 imitating the bit lines BL and /BL. In FIG. 3, the delay line 80 is shown by the bold line. The delay line 80 has a length which is substantially equal to that of each of the bit lines BL and /BL and consequently has capacitances 81 and 82 which are substantially equal to those of the bit lines BL and /BL.

The delay line 80 delays the timing of the pulse waveform input to an input terminal 80A and outputs the delayed pulse waveform from an output terminal 80B. Consequently, the rise time and the fall time of the pulse waveform are increased (i.e., edge waveforms are damped). This allows the timing of outputting the timing signal TS to the sense amplifier SA to be adjusted. To shape the pulse waveform, a buffer including inverters 83 and 84 may also be provided midway in the delay line 80.

(Control Block)

The control block 53 includes the drive circuit 31 which drives the delay line 80, a control signal generation circuit 30A which generates the gate control signals TDEC and ITE to be supplied to the drive circuit 31, and an inverter 66.

Since the configuration of the drive circuit 31 is the same as in FIG. 1, a detailed description of the configuration will not be repeated. To the respective gates of the PMOS transistor P1 and the NMOS transistors N2 and N3 which are included in the drive circuit 31, the shared control signal TDEC is input. To the gate of the NMOS transistor N1 included in the drive circuit 31, the control signal ITE is input. The output node 35 is coupled to the input terminal 80A of the delay line 80. The output terminal 80B of the delay line 80 is coupled to the sense amplifier SA via the inverter 66 and coupled also to a latch circuit 36 provided in the control signal generation circuit 30A.

The drive circuit 31 drives the delay line 80 of the timing replica 51 from the H level to the L level. As a result, the timing signal TS for which the timing has been adjusted is output to the sense amplifier SA. When the timing signal TS is activated, the sense amplifier SA amplifies voltages on the corresponding bit line pair BL and /BL and detects the amplified voltages. Because the access transistor of each of the memory cells MC is the NMOS transistor, the type of each of the MOS transistors N1, N2, and N3 which drive the delay line 80 is also the N-channel MOS transistor.

The control signal generation circuit 30A generates the control signals TDEC and ITE on the basis of the clock signal CLK and the test mode signal TE. In the example in FIG. 3, the test mode signal TE is inactive when on the L level (logic value "0") so that the operation mode is the user mode, while the test mode signal TE is active when on the H level (logic value "1") so that the operation mode is the test mode (referred to also as the timing adjustment mode). In other words, the test mode signal TE is a H-active signal.

Specifically, the control signal 30A includes inverters 61 to 65 and NAND gates 70 to 72. The NAND gates 70 and 71 are included in the latch circuit 36.

To the first input node of the NAND gate 70 included in the latch circuit 36, the clock signal CLK is input via the inverter 61. To the second input node of the NAND gate 70, an output signal from the NAND gate 71 is input. An output signal from the NAND gate 70 is used as an internal clock signal CK1. To the first input node of the NAND gate 71, the internal clock signal CK1 as the output signal from the NAND gate 70 is input. To the second input node of the NAND gate 71, the output terminal 80B of the delay line 80 is coupled.

The internal clock signal CK1 as the output signal from the NAND gate 70 is input as the control signal TDEC to the respective gates of the PMOS transistor P1 and the NMOS transistors N2 and N3 via the inverters 63 and 64. The internal clock signal CK1 is further input to the first input node of the NAND gate 72.

The NAND gate 72 has the first input node which receives the internal clock signal CK1 and the second input node which receives the test mode signal TE input thereto via the inverter 62. An output signal from the NAND gate 72 is input as the control signal ITE to the gate of the NMOS transistor N1 via the inverter 65.

[Operation of Control Block]

Figure 5:
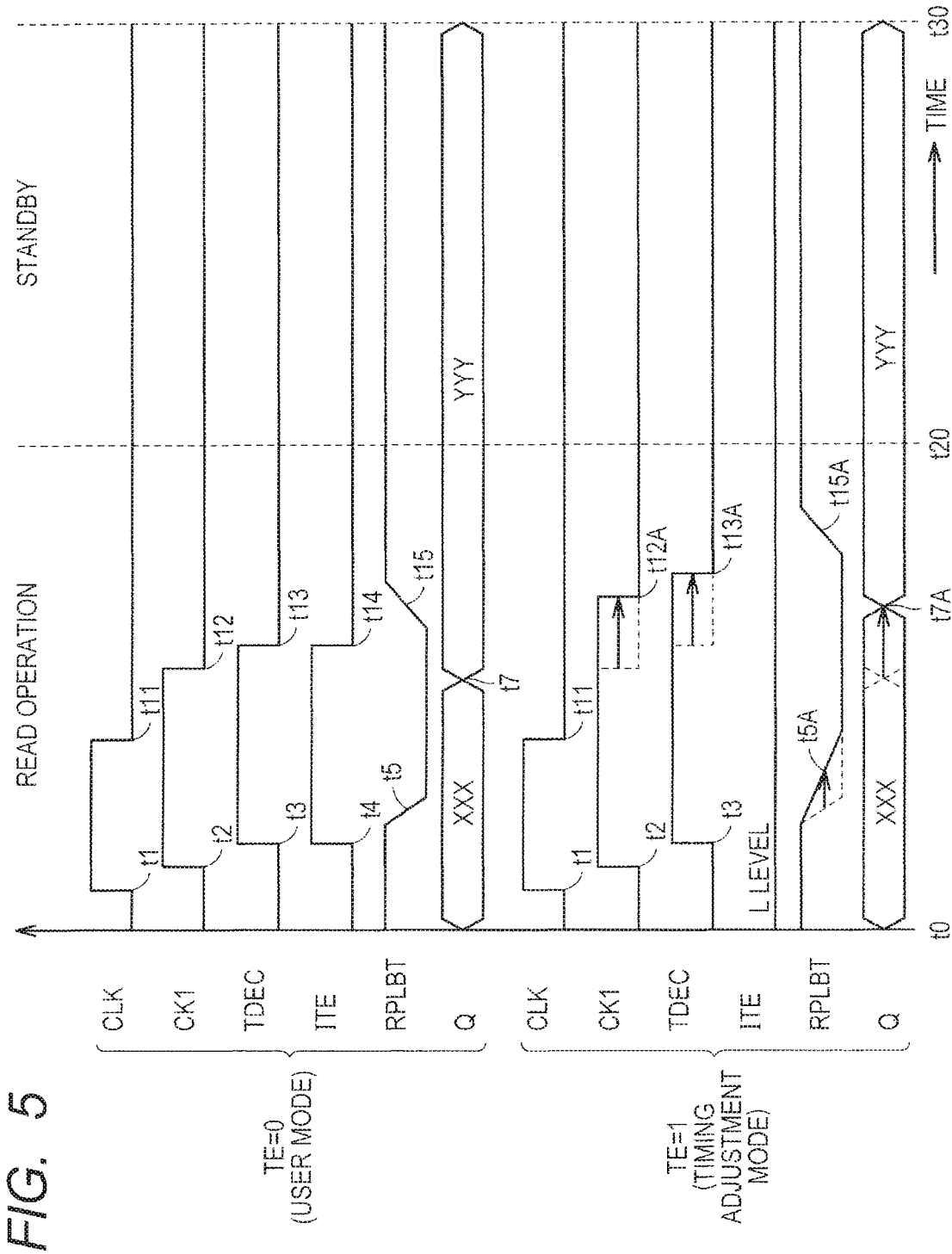
FIG. 5 is a timing chart for illustrating an operation of a control block in FIG. 3.

FIG. 5 is a timing chart for illustrating the operation of the control block in FIG. 3. In FIG. 5, signal waveforms during a read operation is shown between times t0 and t20, while signal waveforms during a standby period is shown between the time t20 and a time t30.

During the standby period, each of the clock signal CLK, the internal clock signal CK1, the control signal TDEC, and the control signal ITE is on the L level. A voltage RPLBT at the input terminal 80A of the delay line 80 provided in the timing replica 51 is on the H level. Since each of the NMOS transistors N1, N2, and N3 is in the OFF state, recovery from BTI degradation can be achieved.

Next, a description will be given separately of a read operation in the user mode and a read operation in the timing adjustment mode.

(1. Read Operation in User Mode (TE=0))

Referring to FIGS. 3 and 5, a description will be given first of the read operation in the user mode (i.e., TE=0 is satisfied). The example in FIG. 5 is characterized in that the control signal TDEC and the control signal ITE are in synchronization, i.e., the two control signals TDEC and ITE change to the L level or the H level with the same timing.

Specifically, when the operation mode is the user mode (TE=0), an output of the inverter 62 is on the H level so that an output of the NAND gate 72 is determined only by the logic value of the internal clock signal CK1. Accordingly, the logic value of the control signal ITE input to the gate of the NMOS transistor N1 is also determined by the internal clock signal CK1.

At a time t1 in FIG. 5, the clock signal CLK changes from the L level to the H level. At a time t2 when the delay time required for the operation of inverting the inverter 61 and the NAND gate 70 has elapsed from the time t1, the internal clock signal CK1 shifts from the L level to the H level.

At a time t3 when the delay time required for the operation of inverting the inverters 63 and 64 has elapsed from the time t2, the control signal TDEC changes from the L level to the H level. As a result, the PMOS transistor P1 is switched from the ON state to the OFF state, while the NMOS transistors N2 and N3 are switched from the OFF state to the ON state.

At a time t4 when the delay time required for the operation of inverting the NAND gate 72 and the inverter 65 has elapsed from the time t2, the control signal ITE changes from the L level to the H level. As a result, the NMOS transistor N1 is switched from the OFF state to the ON state.

In the case of the second embodiment, for the recovery of the NMOS transistor N1 from PBTI degradation, the NMOS transistor N1 is controlled to be in the OFF state when the NMOS transistor N2 is in the OFF state, while being controlled to be in the ON state when the NMOS transistor N2 is in the ON state. To prevent the recovery operation from affecting the operation of the drive circuit 31, the time t4 needs to be substantially coincident with the time t3 or prior to the time t3. FIG. 5 shows the case where the time t3 is substantially coincident with the time t4.

Next, at a time t5 when the delay time required to turn ON the NMOS transistors N1, N2, and N3 has elapsed from the time t3 (=t4), the voltage RPLBT at the input terminal 80A of the delay line 80 changes from the H level to the L level. Due to the capacity of the delay line 80, the change is gentle.

When the delay time resulting from the delay line 80 has elapsed from the time t5, the voltage at the output terminal 80B of the delay line 80 changes from the H level to the L level, though not shown in FIG. 5. Due to the capacity of the delay line 80, the change is gentle.

As a result of the changing of the voltage at the output terminal 80B to the L level, the timing signal TS output from the inverter 66 to the sense amplifier SA in FIG. 3 changes from the L level to the H level. Consequently, the sense amplifier SA starts the operation of amplifying the voltages on the bit line pair BL and /BL. At a time t7, the sense amplifier SA outputs the result Q (i.e., "YYY") of detecting data in the memory cell MC to which the read operation is to be performed.

At a time t11, the clock signal CLK changes from the H level to the L level. At this time, the voltage at the output terminal 80B of the delay line 80 stays on the H level without changing to the L level. Accordingly, to the second input node of the NAND gate 71 included in the latch circuit 36, a H-level signal is input so that the internal clock signal CK1 is held on the H level. In other words, the latch circuit 36 is in a state where the internal clock signal CK1 is held therein (i.e., latched state).

When the voltage at the output terminal 80B then changes from the H level to the L level, an input signal to the second input node of the NAND gate 71 changes from the H level to the L level. This allows the internal clock signal CK1 to change in accordance with the clock signal CLK so that, at a time t12, the internal clock signal CK1 changes from the H level to the L level.

By thus providing the latch circuit 36, the internal clock signal CK1 can be held on the H level at least until the voltage at the output terminal 80B of the delay line 80 changes from the H level to the L level. This allows the sense amplifier SA to reliably detect the data stored in the memory cell MC to which the read operation is to be performed.

In response to the changing of the internal clock signal CK1 to the L level at the time t12, the control signal TDEC changes from the H level to the L level at a time t13 and, at a time t14, the control signal ITE changes from the H level to the L level. As a result, the PMOS transistor P1 is turned ON, while the NMOS transistors N1, N2, and N3 are turned OFF.

As a result of the turning ON of the PMOS transistor P1, at a time t15, the voltage RPLBT at the input terminal 80A of the delay line 80 gently changes from the L level to the H level. When the voltage at the output terminal 80B of the delay line 80 subsequently changes from the L level to the H level, the timing signal TS output from the inverter 66 to the sense amplifier SA changes from the H level to the L level, though not shown in FIG. 5. Consequently, the sense amplifier SA stops operating.

(2. Read Operation in Timing Adjustment Mode (TE=1))

Next, a description will be given of a read operation in the timing adjustment mode (i.e., TE=1 is satisfied). In the case of the timing adjustment mode (TE=1), an output of the inverter 62 is on the L level so that the control signal ITE is constantly on the L level. Consequently, the NMOS transistor N1 is in the normally OFF state. This cuts off the current path in which the NMOS transistors N1 and N2 intervene. As a result, in response to the control signal TDEC, charges are extracted from the delay line 80 only by the NMOS transistor N3, which reduces the driving ability of the drive circuit 31. Consequently, a voltage change on the delay line 80 driven by the drive circuit 31 becomes gentler to increase the delay time resulting from the delay line 80.

Thus, in the timing adjustment mode, the SRAM circuit 101 is operated at a speed lower than in the user mode to ensure an operation margin. Referring to the timing chart of FIG. 5, a specific description will be given below.

When the clock signal CLK changes from the L level to the H level at the time t1, in the same manner as in the case of the user mode, the internal clock signal CK1 changes from the L level to the H level at the time t2, and the control signal TDEC changes from the L level to the H level at the time t3. As a result, the PMOS transistor P1 is turned OFF, while the NMOS transistor N3 is turned ON.

As a result of the turning ON of the NMOS transistor N3, at a time t5A, the voltage RPLBT at the input terminal 80A of the delay line 80 changes from the H level to the L level. As described above, since the driving ability of the driving circuit 31 is lower than in the case of the user mode, the changing of the voltage RPLBT becomes gentler than in the case of the user mode. Consequently, the delay time resulting from the delay line 80 is increased. In FIG. 5, the case of the user mode is shown by the broken line.

When the delay time resulting from the delay line 80 has elapsed from the time t5A, the voltage at the output terminal 80B of the delay line 80 changes from the H level to the L level, though not shown in FIG. 5. As a result, the timing signal TS output from the inverter 66 to the sense amplifier SA in FIG. 3 changes from the L level to the H level. In response to the activation of the timing signal TS, the sense amplifier SA starts the operation of amplifying the voltages on the bit line pair BL and /BL.

At a time t7A, the sense amplifier SA outputs the result of detecting the data Q (i.e., "YYY") in the memory cell MC to which the read operation is to be performed. The time t7A is delayed compared to that (i.e., the time t7) in the case of the user mode by an increase in the delay time resulting from the delay line 80.

At the time t11, the clock signal CLK changes from the H level to the L level. At this time, the voltage at the output terminal 80B of the delay line 80 stays on the H level without changing to the L level so that the internal clock signal CK1 is held on the H level.

Then, as a result of the changing of the voltage at the output terminal 80B from the H level to the L level, at a time t12A, the internal clock signal CK1 changes from the H level to the L level. The time t12A is delayed compared to that (i.e., the time t12) in the case of the user mode by the increase in the delay time resulting from the delay line 80.

As a result of the changing of the internal clock signal CK1 to the L level, at a time t13A, the control signal TDEC changes from the H level to the L level. As a result, the PMOS transistor P1 is turned ON, while the NMOS transistor N3 is turned OFF. The time t13A is delayed compared to that (i.e., the time t13) in the case of the user mode by the increase in the delay time resulting from the delay line 80.

As a result of the turning ON of the PMOS transistor P1, at a time t15A, the voltage RPLBT at the input terminal 80A of the delay line 80 gently changes from the L level to the H level. The delay time t15A is delayed compared to that (i.e., the time t15) in the case of the user mode by the increase in the delay time resulting from the delay line 80.

Subsequently, when the voltage at the output terminal 80B of the delay line 80 changes from the L level to the H level, the timing signal TS output from the inverter 66 to the sense amplifier SA changes from the H level to the L level, though not shown in FIG. 5. As a result, the sense amplifier SA stops operating.

[Layout of Portion of Control Block]

In the semiconductor device in the second embodiment, to prevent the operation of the control block 53 from being affected by controlling the NMOS transistor N1 into the OFF state for the recovery thereof from PBTI degradation, the layout of a portion of the control block 53 is inventively modified. The following will first describe the outline of the layout and then describe the inventive modification of the layout.

(Outline of Layout)

Figure 6:
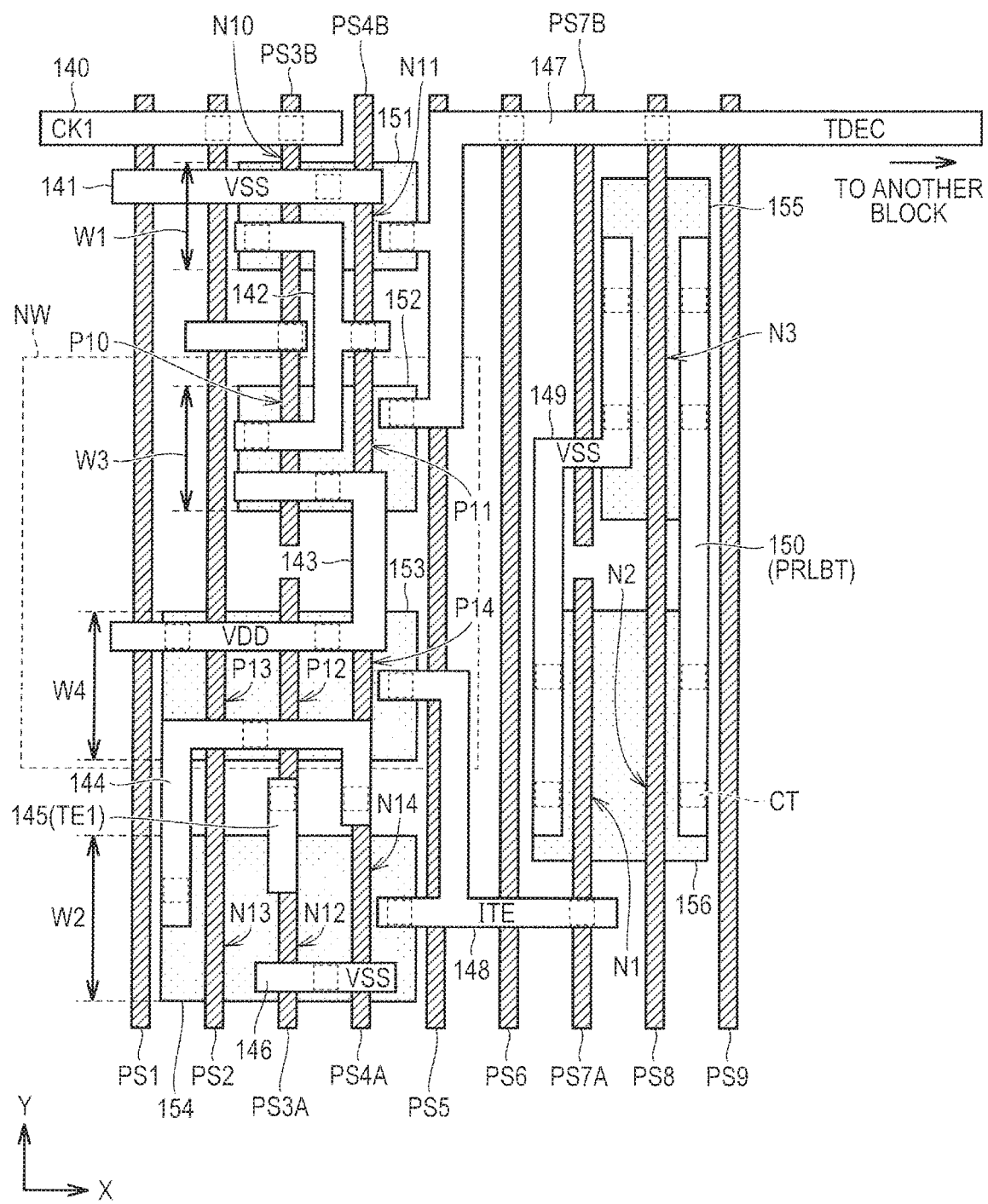
FIG. 6 is a plan view showing the layout of a portion of the control block in FIG. 3.

FIG. 6 is a plan view showing the layout of a portion of the control block in FIG. 3. In FIG. 6, for easier graphic illustration, portions corresponding to polysilicon wires (i.e., gate wires) are hatched with diagonal lines, while impurity regions are hatched with dots. The impurity regions on both sides of each of the gate wires are separated herein by a channel region but, for the sake of convenience, the separated impurity regions are given the same reference numeral. In FIG. 6, the small rectangular portions shown by the broken lines represent contacts CT.

In the drawing, a lateral direction is referred to as an X-direction, while a vertical direction is referred to as a Y-direction. The Y-direction corresponds to the directions in which gate wires PS1 to PS9 extend. In the drawing, the X-direction extending rightward is referred to as a positive X-direction, while the X-direction extending leftward is referred to as a negative X-direction. The same applies also to the Y-direction. In the drawing, the Y-direction extending upward is referred to as a positive Y-direction, while the Y-direction extending downward is referred to as a negative Y-direction.

FIG. 6 shows the layout of the NMOS transistors N1, N2, and N3, the inverters 63 to 65, and the NAND gate 72 in FIG. 3. The following will first describe the layout thereof.

N-type impurity regions 151, P-type impurity regions 152, P-type impurity regions 153, and N-type impurity regions 154 are disposed to be arranged in this order in the Y-direction. The P-type impurity regions 152 and 153 are disposed in a shared N-type well NW. In the drawing, an N-type impurity region 155 is disposed on the right side of (in the positive X-direction from) the impurity regions 151 and 152, while an N-type impurity region 156 is disposed on the right side of (in the positive X-direction from) the impurity region 153.

Each of the gate wires PS1 to PS9 extends in the Y-direction. In the drawing, the gate wires PS1 to PS9 are arranged in this order in a left-right direction. Each of the gate wires PS3, PS4, and PS7 is disconnected midway. In the drawing, the lower (extending in the negative Y-direction) gate wires are respectively denoted by PS3A, PS4A, and PS7A, while the upper (extending in the positive Y-direction) gate wires are respectively denoted by PS3B, PS4B, and PS7B.

As shown in FIG. 6, the gate wire PS7A and the impurity regions 156 on both sides thereof are included in the NMOS transistor N1 in FIG. 3. The gate wire PS8 and the impurity regions 156 on both sides thereof are included in the NMOS transistor N2 in FIG. 3. The portion of the impurity region 156 interposed between the gate wire PS7A and the gate wire PS8 is shared by the NMOS transistors N1 and N2.

The gate wire PS8 and the impurity regions 155 on both sides thereof are included in the NMOS transistor N3 in FIG. 3. The gate wire PS8 is shared by the NMOS transistors N2 and N3. In the drawing, the respective portions of the impurity regions 155 and 156 located on the right side of the gate wire PS8 are coupled together via a metal wire 150 extending in the Y-direction. The metal wire 150 is coupled to the delay line 80 in FIG. 3. On the other hand, in the drawing, the portion of the impurity region 155 located on the left side of the gate wire PS8 and the portion of the impurity region 156 located on the left side of the gate wire PS7A are coupled together via a metal wire 149. To the metal wire 149, the ground voltage VSS is given.

The inverter 64 in FIG. 3 includes an NMOS transistor N11 and a PMOS transistor P11. The gate wire PS4B and the impurity regions 151 on both sides thereof are included in the NMOS transistor N11. The gate wire PS4B and the impurity regions 152 on both sides thereof are included in the PMOS transistor P11. The gate wire PS4B is shared by the NMOS transistor N11 and the PMOS transistor P11.

In the drawing, the portions of the impurity regions 151 and 152 located on the right side of the gate wire PS4B are coupled to the gate wire PS8 via a metal wire 147. The metal wire 147 transmits the control signal TDEC from the inverter 64 to the gates (i.e., the gate wire PS8) of the NMOS transistors N2 and N3. The metal wire 147 is coupled also to the word line decoder 50 and the input/output block 54 in FIG. 3.

The inverter 63 in FIG. 3 includes an NMOS transistor N10 and a PMOS transistor P10. The gate wire PS3B and the impurity regions 151 on both sides thereof are included in the NMOS transistor N10. The portion of the impurity region 151 interposed between the gate wire PS3B and the gate wire PS4B is shared by the NMOS transistors N10 and N11 and receives the ground voltage VSS via a metal wire 141.

The gate wire PS3B and the impurity regions 152 on both sides thereof are included in the PMOS transistor P10. The portion of the impurity region 152 interposed between the gate wire PS3B and the gate wire PS4B is shared by the PMOS transistors P10 and P11 and receives the power supply voltage VDD via a metal wire 143.

In the drawing, the portions of the impurity regions 151 and 152 located on the left side of the gate wire PS3B are coupled to the gate wire PS4B via a metal wire 142. Through the metal wire 142, an output signal from the inverter 63 is input to the inverter 64. To the gate wire PS3B, the internal clock signal CK1 is supplied via a metal wire 140.

The inverter 65 in FIG. 3 includes an NMOS transistor N14 and a PMOS transistor P14. The gate wire PS4A and the impurity regions 154 on both sides thereof are included in the NMOS transistor N14. The gate wire PS4A and the impurity regions 153 on both sides thereof are included in the PMOS transistor P14. The gate wire PS4A is shared by the NMOS transistor N14 and the PMOS transistor P14.

In the drawing, the portions of the impurity regions 154 and 153 located on the right side of the gate wire PS4A are coupled to the gate wire PS7A via a metal wire 148. The metal wire 148 transmits the control signal ITE from the inverter 65 to the gate (i.e., the gate wire PS7A) of the NMOS transistor N1.

The NAND gate 72 in FIG. 3 includes PMOS transistors P12 and P13 and NMOS transistors N12 and N13. The gate wire PS3A and the impurity regions 153 on both sides thereof are included in the PMOS transistor P12. The gate wire PS2 and the impurity regions 153 on both sides thereof are included in the PMOS transistor P13. The gate wire PS3A and the impurity regions 154 on both sides thereof are included in the NMOS transistor N12. The gate wire PS2 and the impurity regions 154 on both sides thereof are included in the NMOS transistor N13.

To the portion of the impurity region 153 interposed between the gate wire PS3A and the gate wire PS4A and the portion of the impurity region 153 located on the left side of the gate wire PS2, the power supply voltage VDD is given via the metal wire 143. To the portion of the impurity region 154 interposed between the gate wire PS3A and the gate wire PS4A, the ground voltage VSS is given via a metal wire 146. The portion of the impurity region 153 interposed between the gate wire PS2 and the gate wire PS3A, the portion of the impurity region 154 located on the left side of the gate wire PS2 in the drawing, and the gate wire PS4A are coupled together via a metal wire 144.

The metal wire 144 described above corresponds to the output node of the NAND gate 72. By the layout described above, between the metal wire 143 corresponding to the VDD power supply node and the output node, the PMOS transistors P12 and P13 are coupled in parallel to each other. Between the metal wire 146 corresponding to the VSS power supply node and the output node, the NMOS transistor N12 and the NMOS transistor N13 are coupled series to each other. An output from the output node (metal wire 144) of the NAND gate 72 is input to the gate wire PS4A of the PMOS transistor P14 and the NMOS transistor N14 which are included in the inverter 65.

To the gate wire PS2 for the PMOS transistor P13 and the NMOS transistor N13, the internal clock signal CK1 is input via the metal wire 140. To the gate wire PS3A for the PMOS transistor P12 and the NMOS transistor N12, an inversion signal TE1 of the test mode signal TE is input via a metal wire 145.

(Inventive Modification of Layout)

Next, a description will be given of an inventive modification of the layout described above. First, it is assumed that a path extending from the metal wire 140 to which the internal clock signal CK1 is given to the gate wire PS7A of the NMOS transistor N1 successively through the gate wire PS2, the metal wire 144, the gate wire PS4A, and the metal wire 148 is a first signal path. The internal clock signal CK1 transmitted via the first signal path is input as the control signal ITE to the gate of the NMOS transistor N1.

On the other hand, it is assumed that a current path extending from the metal wire 140 to the gate wire PS8 for the NMOS transistor N2 successively through the gate wire PS3B, the metal wire 142, the gate wire PS4B, and the metal wire 147 is a second signal path. The internal clock signal CK1 transmitted via the second signal path is input as the control signal TDEC to the gate of the NMOS transistor N2.

In the layout in FIG. 6, the individual circuit elements are placed and wired such that the delay of a signal due to the first current path is equal to or smaller than the delay of a signal due to the second current path. Actually, the length of the first current path is substantially equal to or shorter than the length of the second current path. As a result, the timing of the turning ON of the NMOS transistor N1 is substantially simultaneous with or earlier than the timing of the turning ON of the NMOS transistor N2.

The effect equal to that described above can be achieved by setting the respective threshold voltages of the NMOS transistors N10 to N14 and the PMOS transistors P10 to P14. Specifically, the threshold voltages of the NMOS transistor N12 to N14 and the PMOS transistors P12 to P14 which are associated with the transmission of the control signal ITE are set equal to the threshold voltages of the NMOS transistors N10 and N11 and the PMOS transistors P10 and P11 which are associated with the transmission of the control signal TDEC. Alternatively, the former threshold voltages are set lower than the latter threshold voltages. This allows the signal delay due to the first current path to be equal to or smaller than the signal delay due to the second current path.

The effect equal to that described above can also be achieved by setting a ratio W/L between a gate width W and a channel length L for each of the NMOS transistors N10 to N14 and the PMOS transistors P10 to P14. Specifically, the W/L size in each of the NMOS transistors N12 to N14 and the PMOS transistors P12 to P14 which are associated with the transmission of the control signal ITE is set equal to the W/L size in each of the NMOS transistors N10 and N11 and the PMOS transistors P10 and P11 which are associated with the transmission of the control signal TDEC. Alternatively, the former W/L is set larger than the latter W/L size. This allows the signal delay due to the first current path to be equal to or smaller than the signal delay due to the second current path.

For example, in FIG. 6, it is assumed that W1 is the gate width of each of the NMOS transistors N10 and N11, while W2 is the gate width of each of the NMOS transistors N12 to N14. It is also assumed that W3 is the gate width of each of the PMOS transistors P10 and P11, while W4 is the gate width of each of the PMOS transistors P12 to P14. In this case, by satisfying W1 W2 and W3 W4, the signal delay due to the first current can be set equal to or smaller than the signal delay due to the second current path.

Effects of Second Embodiment

In a memory circuit such as the SRAM circuit, most of internal timings are set using the timing replica 51. Accordingly, when the NMOS transistors N1, N2, and N3 provided in the drive circuit 31 that drives the delay line 80 of the timing replica 51 are degraded by BTI, timings significantly change compared to those in other standard cells and IP (Intellectual Property) cells. As a result, the timing of an output signal from the memory circuit may not match the timing in an external IP cell. Therefore, in the memory circuit, it is necessary to pay sufficient attention to the BTI degradation of the MOS transistors associated with a circuit which generates internal timings.

According to the first embodiment described above, during the standby period, the NMOS transistor N1 used as a mode changeover switch is on standby in the OFF state and is consequently unaffected by BTI degradation. It is also possible to expect recovery from the BT degradation.

During a read operation, the mode selection NMOS transistor N1 is controlled to be turned ON and OFF in synchronization with the other NMOS transistors N2 and N3. This can prevent the mode selection NMOS transistor N1 from being affected by BTI degradation without interrupting the operation of the drive circuit 31.

Preferably, the control signal generation circuit 30A is designed such that the operation timing of the gate control circuit for the NMOS transistor N1 is simultaneous with or earlier than the operation timings of the gate control circuits for the NMOS transistors N2 and N3. Thus, it is possible to prevent the high-speed operation of the SRAM circuit from being interrupted.

For example, the threshold voltage of the gate control MOS transistor for the NMOS transistor N1 is set substantially equal to the threshold voltages of the gate control MOS transistors of the NMOS transistors N2 and N3. As a result, even when any of a process, a power supply voltage, and an operating temperature varies, the threshold voltages of the three MOS transistors similarly vary. This can prevent a situation in which the switching of the NMOS transistor N1 is behind the switching of the NMOS transistors N2 and N3.

Third Embodiment

In the second embodiment, the timing of the turning ON of the mode selection NMOS transistor N1 needs to be set simultaneous with or earlier than the timing of the turning ON of the NMOS transistor N2. Accordingly, it is necessary to pay attention to the control of the timing of the gate control signal ITE of the NMOS transistor N1. A third embodiment discloses a method which simplifies the control of the timing of the control signal ITE.

[Configuration of Semiconductor Device]

Figure 7:
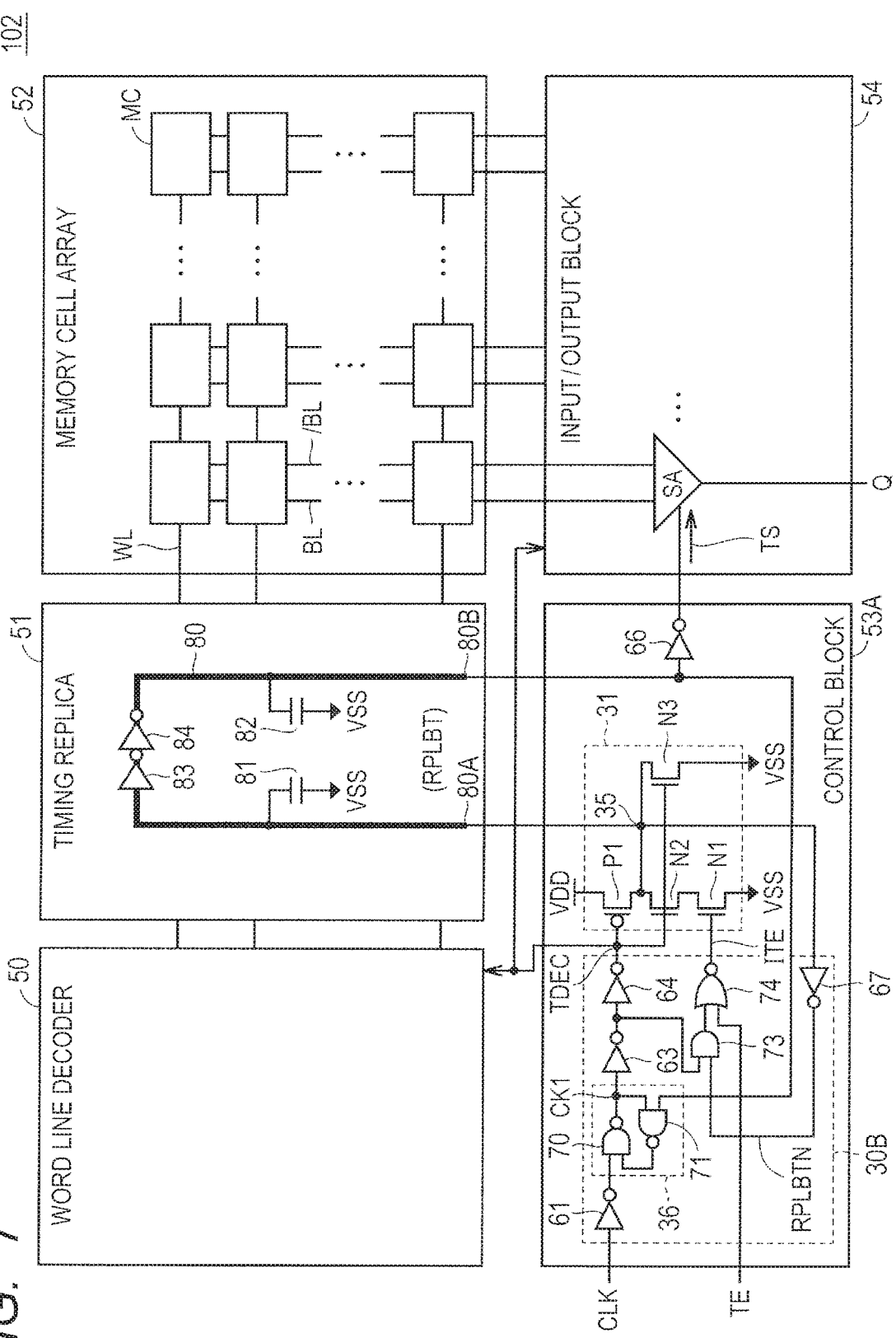
FIG. 7 is a block diagram showing a portion of a configuration of an SRAM circuit as a semiconductor device according to a third embodiment.

FIG. 7 is a block diagram showing a portion of a configuration of an SRAM circuit as a semiconductor device according to the third embodiment. FIG. 7 also shows an example of a further detailed circuit diagram of a control block 53A.

A semiconductor device 102 in FIG. 7 corresponds to the semiconductor device 101 in FIG. 3, but is different therefrom in the configuration of a control signal generation circuit. Specifically, a control signal generation circuit 30B in FIG. 7 is different from the control signal generation circuit 30A in FIG. 3 in that, instead of the inverters 62 and 65 and the NAND gate 72, an inverter 67, an AND gate 73, and a NOR gate 74 are provided therein. Note that the AND gate 73 can be replaced with a NAND gate and an inverter coupled to the output node thereof.

Referring to FIG. 7, the first node of the AND gate 73 is coupled to the coupling node between the inverters 63 and 64. To the second input node of the AND gate 73, a signal resulting from the inversion of the logic value of a voltage at the output node 35 of the drive circuit 31 by the inverter 67 is input. Note that the voltage at the output node 35 is equal to the voltage RPLBT at the input terminal 80A of the delay line 80. An output signal from the inverter 67 is hereinafter denoted by RPLBTN.

To the first input node of the NOR gate 74, an output signal from the AND gate 73 is input. To the second input node of the NOR gate 74, the test mode signal TE is input. The output node of the NOR gate 74 is coupled to the gate of the NMOS transistor N1.

Since FIG. 7 is otherwise the same as in the case of FIG. 3, like or equivalent portions are given like reference numerals and the description thereof will not be repeated.

[Operation of Control Block]

The following will describe the operation of the control block 53A of the configuration in FIG. 7.

First, in the case of the timing adjustment mode (TE=1), the control signal ITE output from the NOR gate 74 is fixed to the L level so that the NMOS transistor N1 is brought into the normally OFF state. Since the operation of the control block 53A associated with the control signal TDEC is the same as that of the control block 53 in the case of FIG. 3, the description thereof will not be repeated.

Next, in the case of the user mode (TE=0), the logic level of the control signal ITE output from the NOR gate 74 is determined only by the output signal from the AND gate 73. The output signal from the AND gate 73 is on the H level when the internal clock signal CK1 is on the L level and the voltage RPLBT at the input terminal 80A of the delay line 80 is on the L level. In this case, the control signal ITE output from the NOR gate 74 is on the L level so that the NMOS transistor N1 is brought into the OFF state.

On the other hand, when at least one of the internal clock signal CK1 and the voltage RPLBT is on the H level, the output signal from the AND gate 73 is on the L level. In this case, the control signal ITE output from the NOR gate 74 is on the H level so that the NMOS transistor N1 is brought into the ON state.

Figure 8:
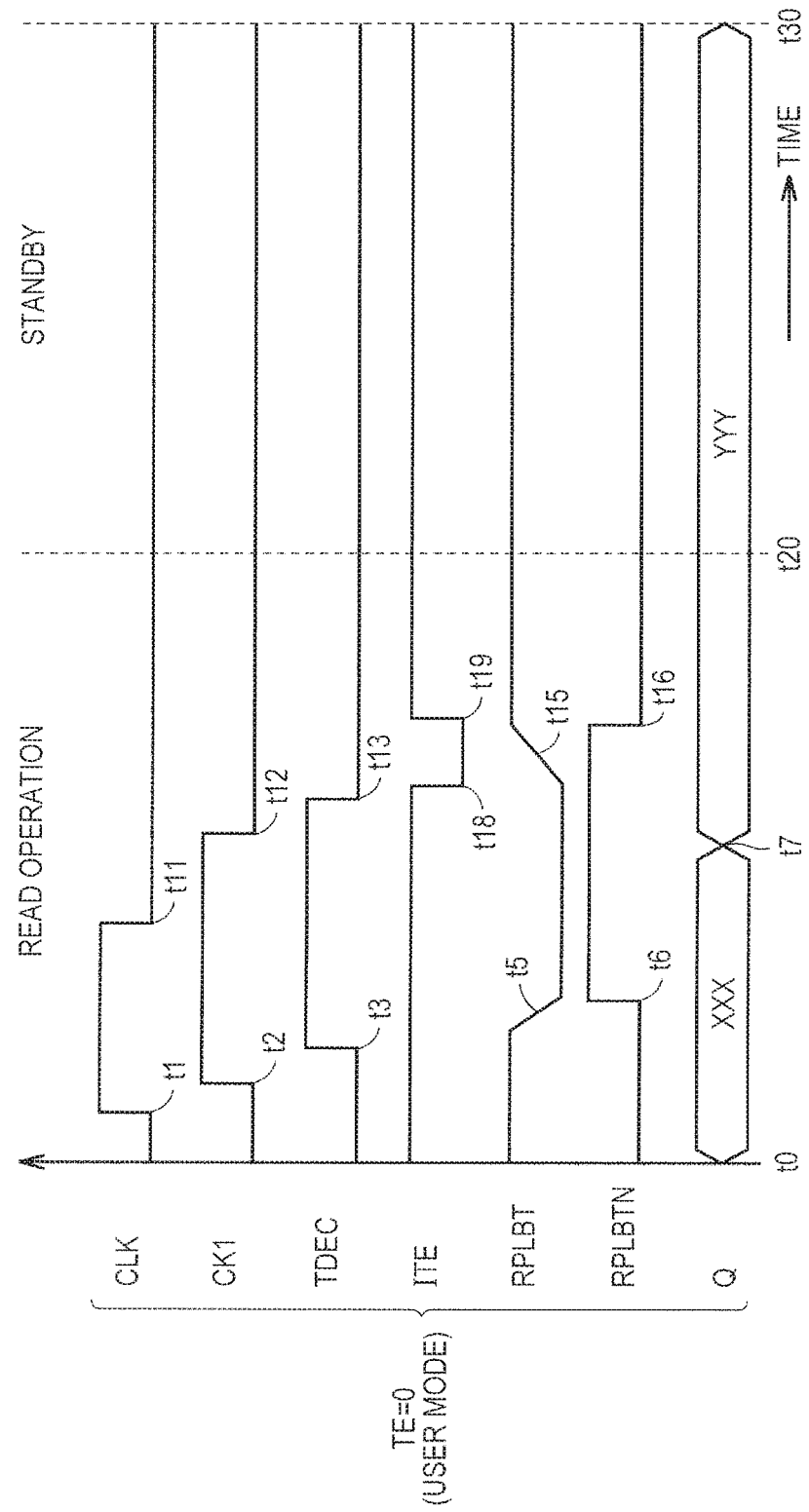
FIG. 8 is a timing chart for illustrating an operation of a control block in FIG. 7 in a user mode (TE=0)

The operation in the case of the user mode described above will be described in greater detail with reference to the timing chart of FIG. 8. FIG. 8 is the timing chart for illustrating the operation of the control block in FIG. 7 in the user mode (TE=0).

Referring to FIG. 8, during the standby period, the clock signal CLK, the internal clock signal CK1, the control signal TDEC, and the control signal ITE are all on the L level. The voltage RPLBT at the input terminal 80A of the delay line 80 provided in the timing replica 51 is on the H level. Since the NMOS transistors N1, N2, and N3 are all brought into the OFF state, recovery from BTI degradation can be achieved.

When the clock signal CLK changes from the L level to the H level at the time t1, in the same manner as in the case of the user mode in FIG. 5, the internal clock signal CK1 changes from the L level to the H level at the time t2, and the control signal TDEC changes from the L level to the H level at the time t3. As a result, the PMOS transistor P1 is turned OFF, while the NMOS transistors N2 and N3 are turned ON. Note that, since the voltage RPLBT at the input terminal 80A of the delay line 80 is held at this time on the H level in the same manner as in the standby state, the NMOS transistor N1 stays in the ON state.

As a result of the turning ON of the NMOS transistors N2 and N3, at the time t5, the voltage RPLBT at the input terminal 80A of the delay line 80 changes from the H level to the L level. As a result, at the time t6, the output signal RPLBTN from the inverter 67 changes from the L level to the H level. However, at this time, the internal clock signal CK1 is on the H level so that the NMOS transistor N1 stays in the ON state.

When the delay time resulting from the delay line 80 has elapsed from the time t5, the voltage at the output terminal 80B of the delay line 80 changes from the H level to the L level, though not shown in FIG. 8. As a result, the timing signal TS output from the inverter 66 to the sense amplifier SA in FIG. 7 changes from the L level to the H level. In response to the activation of the timing signal TS, the sense amplifier SA starts the operation of amplifying voltages on the bit line pair BL and /BL. At the time t7, the sense amplifier SA outputs the result Q (i.e., "YYY") of detecting data in the memory cell MC to which a read operation is to be performed.

At the time t11, the clock signal CLK changes from the H level to the L level. At this time, the voltage at the output terminal 80B of the delay line 80 stays on the H level without changing to the L level so that the internal clock signal CK1 is held on the H level. Then, as a result of the changing of the voltage at the output terminal 80B from the H level to the L level, at the time t12, the internal clock signal CK1 changes from the H level to the L level.

As a result of the changing of the internal clock signal CK1 to the L level at the time t12, at the time t13, the control signal TDEC changes from the H level to the L level. As a result, the PMOS transistor P1 is turned ON, while the NMOS transistors N2 and N3 are turned OFF.

At the time t12, the output signal RPLBTN from the inverter 67 is already on the H level so that, at a time t18, the control signal ITE changes from the H level to the L level. As a result, the NMOS transistor N1 is allowed to recover from BTI degradation.

As a result of the turning ON of the PMOS transistor P1, at the time t15, the voltage RPLBT at the input terminal 80A of the delay line 80 gently changes from the L level to the H level. Consequently, at the time t16, the output signal RPLBTN from the inverter 67 changes from the H level to the L level. As a result of the changing of the output signal RPLBTN to the L level, at a time t19, the control signal ITE changes from the L level to the H level. Consequently, the NMOS transistor N1 is returned to the ON state.

Effects of Third Embodiment

As described above, in the third embodiment, the control signal ITE is controlled to the L level when the read operation to the SRAM circuit is ended as a result of the changing of the internal clock signal CK1 from the H level to the L level. Accordingly, the read operation to the SRAM circuit remains unaffected. Unlike in the case of the second embodiment, it is possible to allow the NMOS transistor N1 to recover from BTI degradation without giving consideration to the timing of the changing of the control signal ITE.

The control signal ITE is on the L level only during a limited period during which the control signal ITE has a pulsed waveform (i.e., period from the time t18 to the time t19 in FIG. 8), but this period can be elongated. Specifically, when an even number of delay inverters are coupled in series to the inverter 67 in FIG. 7, the delay time of the output signal RPLBTN increases. This can delay the changing of the control signal ITE to the H level at the time t19 and thus elongate the period during which the control signal ITE is on the L level.

Fourth Embodiment

In a fourth embodiment, a description will be given of a method which uses another operation mode signal MD other than the test mode signal TE and thus intends to allow the NMOS transistor N1 to recover from BTI degradation.

[Configuration of Semiconductor Device]

Figure 9:
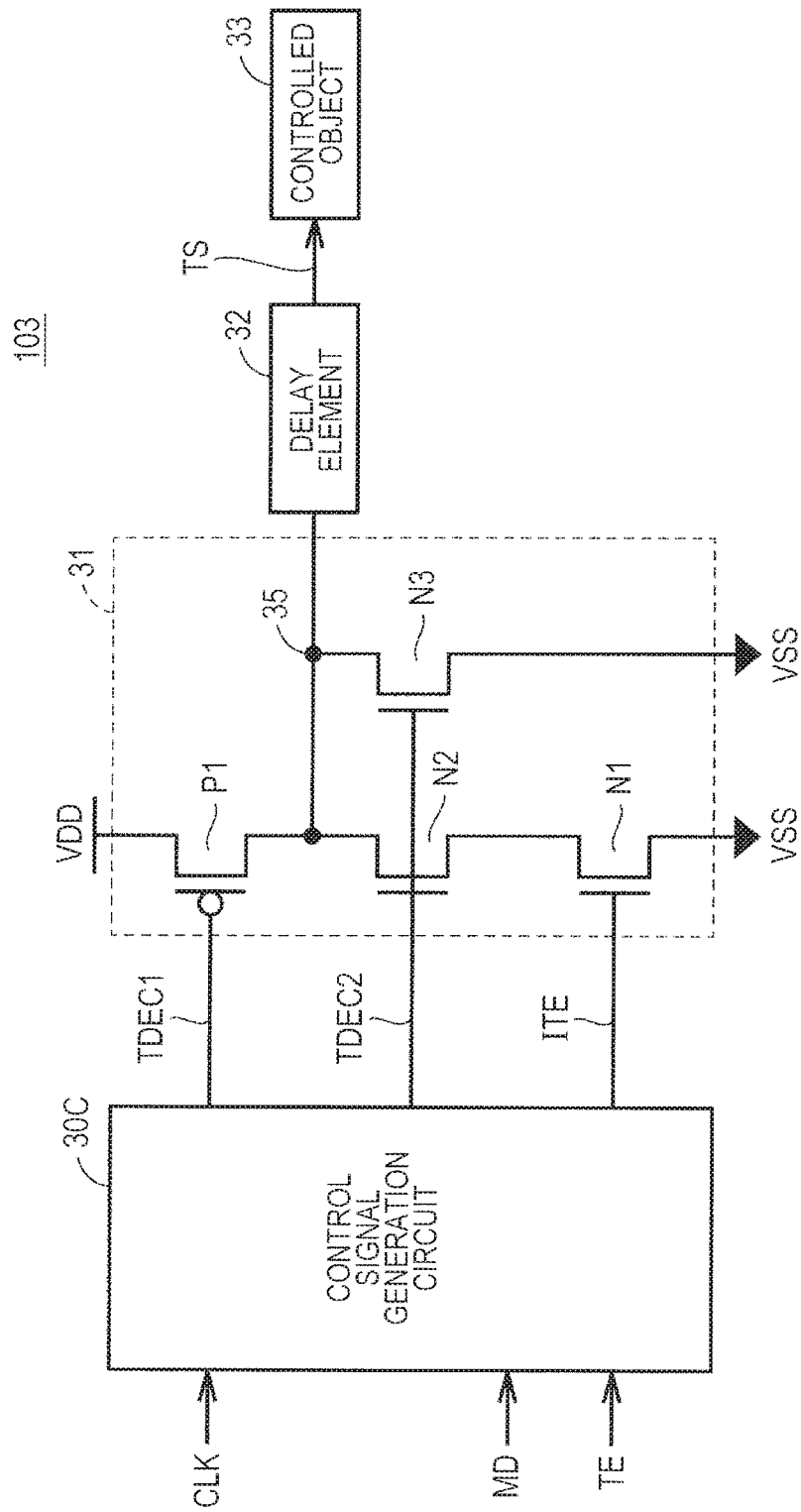
FIG. 9 is a block diagram showing a configuration of a portion of a semiconductor device according to a fourth embodiment.

FIG. 9 is a block diagram showing a configuration of a portion of a semiconductor device according to the fourth embodiment.

A control signal generation circuit 30C in a semiconductor device 103 in FIG. 9 is different from the semiconductor device 100 in FIG. 1 in that, in addition to the clock signal CLK and the test mode signal TE, the other operation mode signal MD is input thereto. In this disclosure, the operation mode signal MD may be referred to as a first operation mode signal, while the test mode signal TE may be referred to as a second operation mode signal.

The operation mode signal MD has a higher priority than that of the test mode signal TE. In addition, when the operation mode signal MD is in the active state, the drive circuit 31 need not be operated. Accordingly, when the operation mode signal MD is in the active state, it is possible to allow the NMOS transistor N1 to recover from BTI degradation by inactivating the control signal ITE and turning OFF the NMOS transistor N1.

Since the configuration in FIG. 9 is otherwise the same as in the case of FIG. 1, like or equivalent portions are given like reference numerals and the description thereof will not be repeated.

[Operation of Control Signal Generation Circuit]

Figure 10:
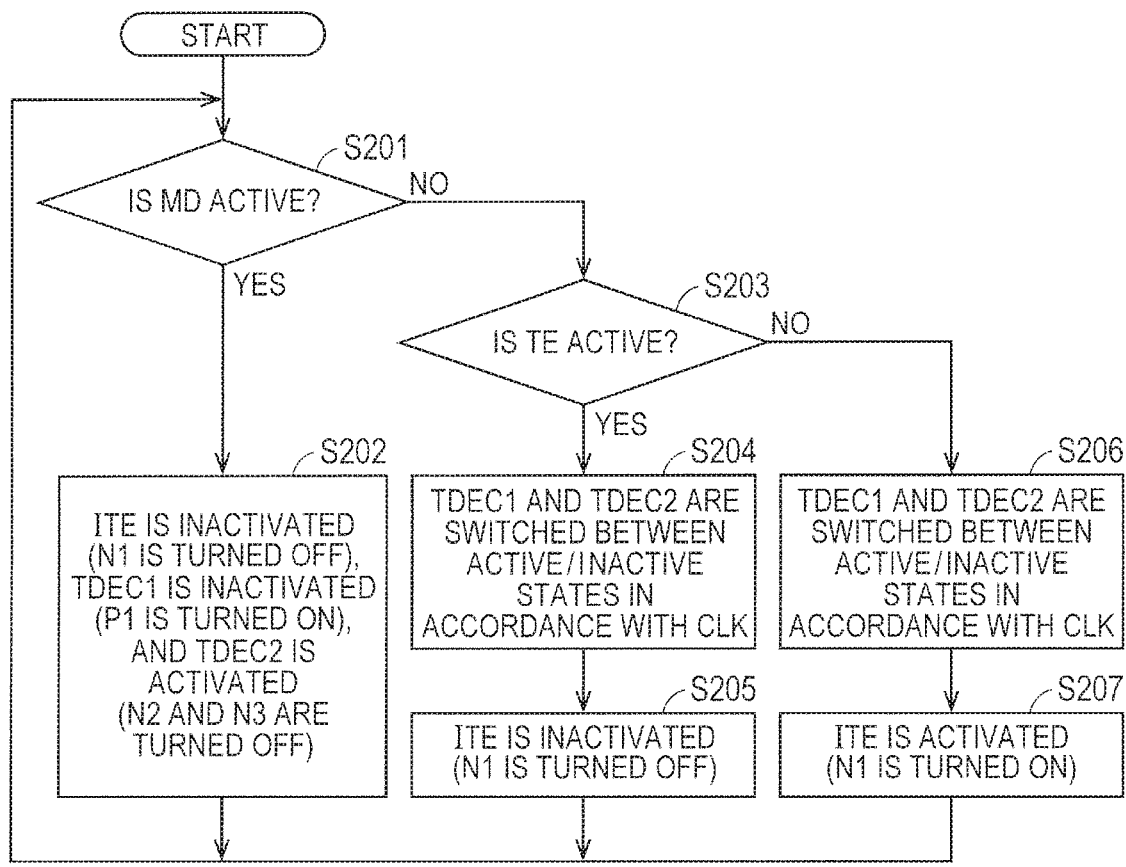
FIG. 10 is a flow chart showing an operation of a control signal generation circuit in FIG. 9.

FIG. 10 is a flow chart showing the operation of the control signal generation circuit in FIG. 9.

Referring to FIGS. 9 and 10, when the operation mode signal MD is active (YES in S201), the control signal generation circuit 30C need not operate the drive circuit 31. Accordingly, the control signal generation circuit 30C inactivates the control signal ITE (S202) to thus allow the NMOS transistor N1 to recover from BTI degradation without interrupting the operation of the semiconductor device 103.

The operation of the drive circuit 31 may also be stopped by halting the clock signal CLK. In this case, for example, the control signal generation circuit 30C fixes the PMOS transistor P1 to the ON state by activating the control signal TDEC1 and fixes the NMOS transistors N2 and N3 to the OFF state by inactivating the control signal TDEC2 (S202).

On the other hand, when the operation mode signal MD is inactive (NO in S201), the control signal generation circuit 30C switches the control signal ITE between the inactive state and the active state depending on whether the test mode signal TE is active or inactive.

Specifically, when the operation mode signal MD is inactive (NO in S201) and the test mode signal TE is active (YES in S203) (i.e., when the operation mode is the test mode), the control signal generation circuit 30C switches one of the control signals TDEC1 and TDEC2 to the active state and switches the other of the control signals TDEC1 and TDEC2 to the inactive state in accordance with the clock signal CLK (S204). Then, the control signal generation circuit 30C brings the control signal ITE into the normally inactive state (S205). Consequently, the NMOS transistor N1 is in the OFF state so that the current path in which the NMOS transistors N1 and N2 intervene is cut off. As a result, the delay time of the timing signal TS increases to be able to increase the operation margin.

On the other hand, when the operation mode signal MD is inactive (NO in S201) and the test mode signal TE is inactive (NO in S203) (i.e., when the operation mode is the user mode), the control signal generation circuit 30C switches one of the control signals TDEC1 and TDEC2 to the active state and switches the other of the control signals TDEC1 and TDEC2 to the inactive state in accordance with the clock signal CLK (S206). Then, the control signal generation circuit 30C brings the control signal ITE into the normally active state (S207). This prevents the current path in which the NMOS transistors N1 and N2 intervene from being cut off. Consequently, a current flows from the output node 35 to the VSS power supply node via both of the path in which the NMOS transistors N1 and N2 intervene and the path in which the NMOS transistor N3 intervenes. As a result, it is possible to reduce the delay time of the timing signal TS.

Effects of Fourth Embodiment

In the fourth embodiment, by using the operation mode signal MD which can be switched to the active state or to the inactive state when the test mode signal TE is inactive, it is possible to control the NMOS transistor N1 into the OFF state with timing which does not affect the operation of the semiconductor device 103 when the operation mode signal MD is active. As a result, it is possible to allow the NMOS transistor N1 to recover from BTI degradation. When the time during which the operation mode signal MD is controlled to be in the active state is sufficiently long, it is possible to allow the NMOS transistor N1 to sufficiently recover from BTI degradation.

Fifth Embodiment

In the fifth embodiment, using an SRAM circuit as an example, a description will be given of the case where the controlled object 33 described using FIG. 9 in the fourth embodiment corresponds to the sense amplifier SA and the operation mode signal MD corresponds to a resume standby signal.

A resume standby mode (referred to also as low power consumption mode) mentioned herein is intended to stop the operation of the SRAM circuit in the state where the data stored in the memory cell array 52 is held. In this case, a ground wire LCVSS for peripheral circuits around the SRAM circuit is disconnected from the ground voltage VSS and brought into a floating state. On the other hand, a ground wire ARVSS for the memory cell array 52 is controlled into the state where a potential therein is higher than the ground voltage VSS. This can reduce a leakage current in the MOS transistor included in the memory cell array 52. The following will give a detailed description thereof with reference to the drawings.

[Configuration of SRAM Circuit]

Figure 11:
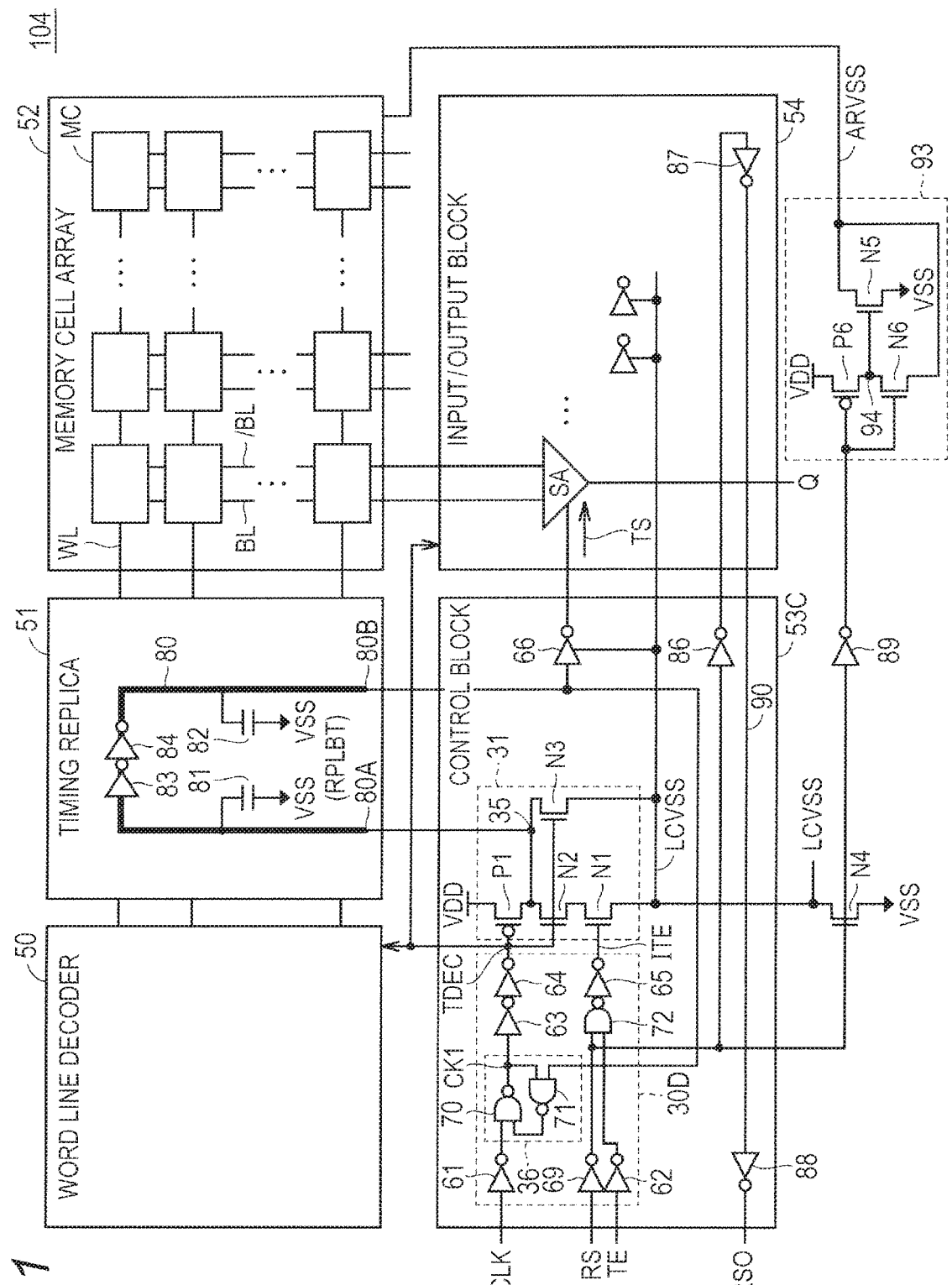
FIG. 11 is a block diagram showing a portion of a configuration of an SRAM circuit as a semiconductor device according to a fifth embodiment.

FIG. 11 is a block diagram showing a portion of a configuration of the SRAM circuit as a semiconductor device according to a fifth embodiment. FIG. 11 also shows an example of a detailed circuit diagram of a control block 53C.

A semiconductor device 104 in FIG. 11 is different from the semiconductor device 101 in FIG. 3 in that the configuration of the control signal generation circuit 30A is modified and that a circuit used in the resume standby mode is added thereto.

Specifically, a control signal generation circuit 30D in FIG. 11 is different from the control signal generation circuit 30A in FIG. 3 in that an inverter 69 is further included therein and, to the first input node of the NAND gate 72, a resume standby signal RS, instead of the internal clock signal CK1, is input via the inverter 69.

The semiconductor device 104 in FIG. 11 further includes, as components for the resume standby mode, an NMOS transistor N4 coupled between the ground wire LCVSS for the peripheral circuits and the VSS power supply node, a delay line 90 for the resume standby signal RS, a ground voltage control circuit 93 for the ground wire ARVSS for the memory cell array 52, and inverters 86 to 89.

Figure 12:
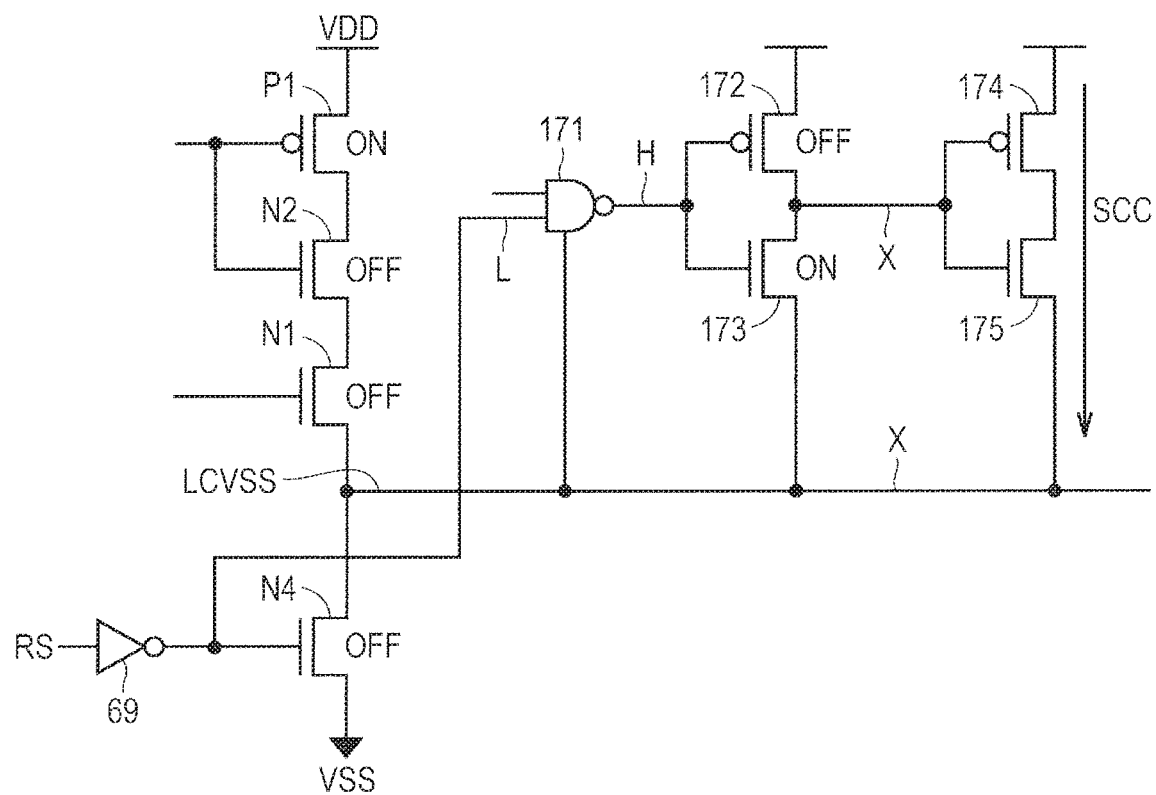
FIG. 12 is a view for illustrating a voltage on a ground wire LCVSS for peripheral circuits during a resume/standby mode period.

The ground wire LCVSS is a shared ground wire used in the peripheral circuits such as the word line decoder 50, the timing replica 51, the control block 53C, and the input/output block 54. During a resume standby mode period, the NMOS transistor N4 is controlled to be in the OFF state. In this case, the ground wire LCVSS may have a voltage (referred to as a middle level) between the ground voltage VSS and the power supply voltage VDD. Referring to FIG. 12, the reason for this will be described.

FIG. 12 is a view for illustrating the voltage on the ground wire LCVSS for the peripheral circuits during the resume standby mode period.

Referring to FIG. 12, the ground wire LCVSS is coupled to the source of the NMOS transistor N1 in the drive circuit 31 and coupled also to the drain of the NMOS transistor N4. The ground wire LCVSS is coupled also to the source of the NMOS transistor provided in another circuit block.

For example, in the example in FIG. 12, the ground wire LCVSS is coupled to the source of the NMOS transistor included in a NAND gate 171. The ground wire LCVSS is coupled also to an inverter including a PMOS transistor 172 and an NMOS transistor 173, while being coupled to an inverter including a PMOS transistor 174 and an NMOS transistor 175.

In the example in FIG. 12, the output node of the inverter 69 is coupled to one of the input nodes of the NAND gate 171. The output node of the NAND gate 171 is coupled to each of the gates of the PMOS transistor 172 and the NMOS transistor 173. The coupling node between the PMOS transistor 172 and the NMOS transistor 173 is coupled to each of the gates of the PMOS transistor 174 and the NMOS transistor 175.

In the configuration described above, during the resume standby mode period, i.e., when the resume standby signal RS is on the H level, the PMOS transistor P1 is controlled to be in the ON state, while the NMOS transistors N1, N2, and N4 are controlled to be in the OFF state. As a result, the logic level on the ground wire LCVSS becomes indefinite (in a floating state). In FIG. 12, an indefinite state is shown by "X".

To the NAND gate 171, an L-level signal is input so that an output signal from the NAND gate 171 is on the H level. As a result, the PMOS transistor 172 is brought into the OFF state, while the NMOS transistor 173 is brought into the ON state. At this time, since the logic level in each of the gates of the PMOS transistor 174 and the NMOS transistor 175 is in the indefinite state (X), a through current SCC may flow via the PMOS transistor 174 and the NMOS transistor 175. When the through current SCC flows, the ground wire LCVSS is charged so that the voltage thereon is increased.

It is to be noted herein that, when the voltage on the ground wire LCVSS becomes higher than the ground voltage VSS, between the gate and the source of the NMOS transistor N1, a reversely biased state is provided. Accordingly, a higher effect of allowing recovery from BTI degradation can be expected.

Referring again to FIG. 11, the delay line 90 for the resume standby signal RS will be described. One end of the delay line 90 is coupled to the output node of the inverter 69. From the other end RSO of the delay line 90, the resume standby signal RS is output to another circuit module. The delay line 90 is designed to have a length in accordance with the size of the circuit module. Accordingly, as the size of the circuit module is larger, the amount of delay resulting from the delay line 90 is larger. On the delay line 90, the signal shaping inverters 86 and 87 may also be provided.

The NMOS transistor N4 is provided between the ground wire LCVSS for the peripheral circuits and the VSS power supply node. The gate of the NMOS transistor N4 is coupled to the output node of the inverter 69. Accordingly, when the resume standby signal RS is in the active state (on the H level), the NMOS transistor N4 is in the OFF state so that the ground wire LCVSS for the peripheral circuits is in the floating state (may actually be placed on the middle level by the through current SCC). When the resume standby signal RS is in the inactive state (on the L level), the NMOS transistor N4 is in the ON state so that the voltage on the ground wire LCVSS for the peripheral circuits is equal to the ground voltage VSS.

The ground voltage control circuit 93 includes NMOS transistors N5 and N6 and a PMOS transistor P6. The PMOS transistor P6 and the NMOS transistor N6 are arranged in this order and coupled between the VDD power supply node and the ground wire ARVSS for the memory cell array. Each of the gates of the PMOS transistor P6 and the NMOS transistor N6 is coupled to the output node of the inverter 69 via the inverter 89. The NMOS transistor N5 is coupled between the ground wire ARVSS and the VSS power supply node. The gate of the NMOS transistor N5 is coupled to a coupling node 94 between the PMOS transistor P6 and the NMOS transistor N6.

In the configuration of the ground voltage control circuit 93 described above, when the resume standby signal RS is in the inactive state (on the L level), the PMOS transistor P6 is in the ON state, the NMOS transistor N6 is in the OFF state, and the NMOS transistor N5 is in the ON state. Accordingly, the voltage on the ground wire ARVSS for the memory cell array 52 is equal to the ground voltage VSS. On the other hand, when the resume standby signal RS is in the active state (on the H level), the PMOS transistor P6 is in the OFF state, while the NMOS transistor N6 is in the ON state. In this case, the NMOS transistor N5 is diode-coupled so that the voltage on the ground wire ARVSS is higher than the ground voltage VSS by the threshold voltage of the NMOS transistor N5.

[Configuration of Modification]

Figure 13:
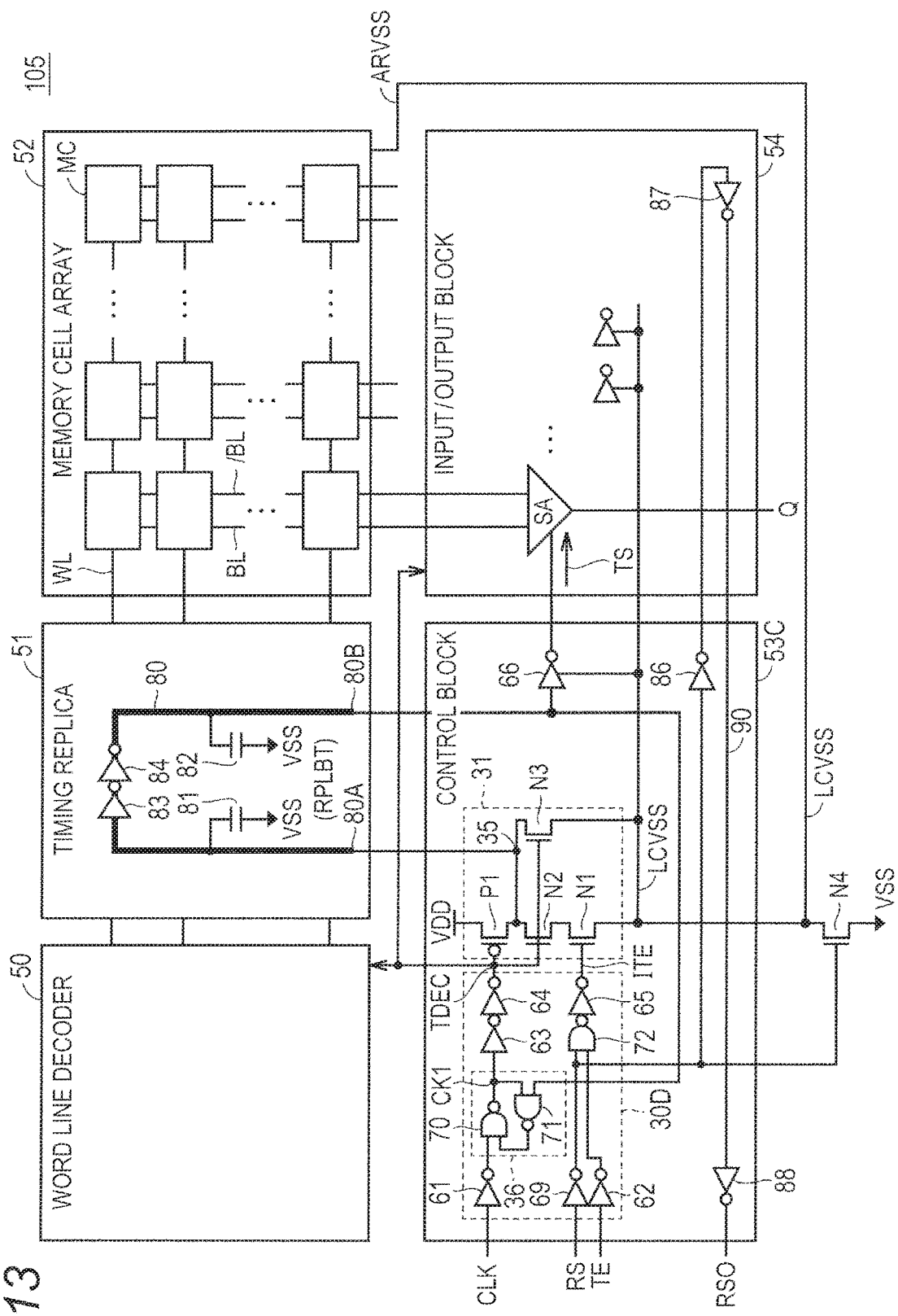
FIG. 13 is a circuit diagram showing a modification of the SRAM circuit in FIG. 11.

FIG. 13 is a circuit diagram showing a modification of the SRAM circuit in FIG. 11. A semiconductor device 105 in FIG. 13 is different from the semiconductor device 104 in FIG. 11 in that the inverter 89 and the ground voltage control circuit 93 are not provided therein. In the case in FIG. 13, a shared wire is used as each of the ground wire ARVSS for the memory cell array 52 and the ground wire LCVSS for the peripheral circuits. In the resume standby mode, when there is no need to hold the information stored in the memory cell array 52, such a simplified configuration may also be used.

When the configuration in FIG. 13 is adopted, during the resume standby mode period, a current may flow in the ground wire LCVSS via the MOS transistors in the memory cell array 52. Accordingly, it can be expected that the ground wire LCVSS has a higher voltage. As a result, a higher effect of allowing the NMOS transistor N1 to recover from BTI degradation can be expected.

[Operation of Control Block]

The following will describe the operation of the control block 53C in the configuration in FIG. 11.

First, when the resume standby signal RS is in the inactive state (on the L level) and the operation mode is the timing adjustment mode (TE=1), the signal output from the inverter 62 to the NAND gate 72 is on the L level so that the control signal ITE input to the gate of the NMOS transistor N1 is fixed to the L level. Consequently, the NMOS transistor N1 is in the normally OFF state. Since the operation of the control block 53C associated with the control signal TDEC is the same as in the case of the control block 53 in FIG. 3, the description thereof will not be repeated.

Next, when the resume standby signal RS is in the inactive state (on the L level) and the operation mode is the user mode (TE=0), the signal output from the inverter 62 to the NAND gate 72 is on the H level so that the control signal ITE input to the gate of the NMOS transistor N1 is fixed to the H level. Consequently, the NMOS transistor N1 is in the normally ON state. Since the operation of the control block 53A associated with the control signal TDEC is the same as in the case of the control block 53 in FIG. 3, the description thereof will not be repeated.

When the resume standby signal RS is in the active state (on the H level), the control signal ITE input to the gate of the NMOS transistor N1 is fixed to the L level. Accordingly, the NMOS transistor N1 is in the normally OFF state. Note that, in the resume standby mode, the operation of the SRAM circuit is stopped so that each of the clock signal CLK, the internal clock signal CK1, and the control signal TDEC is fixed to the L level. In this case, the voltage on the delay line 80 provided in the timing replica 51 is on the H level, the NMOS transistors N2 and N3 are in the OFF state, and the PMOS transistor P1 is in the ON state.

The operation in the case of the user mode described above will be described in greater detail with reference to the timing chart of FIG. 14.

Figure 14:
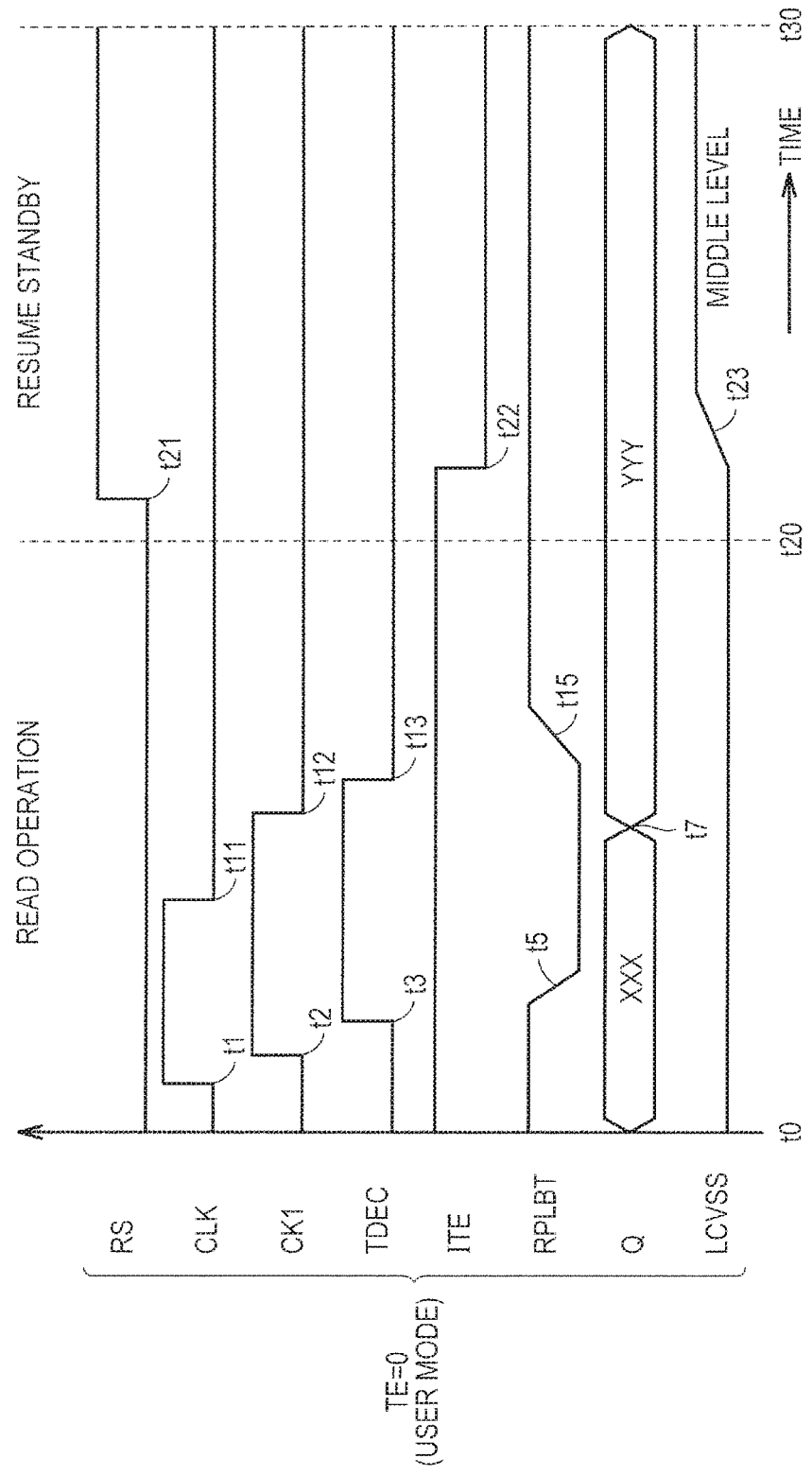
FIG. 14 is a timing chart for illustrating an operation of a control block in FIG. 11 in the user mode (TE=0)

FIG. 14 is the timing chart for illustrating the operation of the control block in FIG. 11 in the user mode (TE=0). In FIG. 14, between the time t0 and the time t20, signal waveforms in a read operation during a normal operation period (when the operation mode is not the resume standby mode) are shown while, between the time t20 and the time t30, waveforms in the resume standby mode are shown.

Referring to FIGS. 11 and 14, a description will be given of the case during the normal operation period (RS=0). In this case, the control signal ITE is fixed to the H level so that the NMOS transistor N1 is in the normally ON state.

When the clock signal CLK changes from the L level to the H level at the time t1, in the same manner as in the case of the user mode in FIG. 5, the internal clock signal CK1 changes from the L level to the H level at the time t2, and the control signal TDEC changes from the L level to the H level at the time t3. As a result, the PMOS transistor P1 is turned OFF, while the NMOS transistors N2 and N3 are turned ON.

As a result of the turning ON of the NMOS transistors N2 and N3, a current flows from the output node 35 to the VSS power supply node via the NMOS transistors N1, N2, and N3. As a result, at the time t5, the voltage RPLBT at the input terminal 80A of the delay line 80 changes from the H level to the L level.

When the delay time resulting from the delay line 80 has elapsed from the time t5, the voltage at the output terminal 80B of the delay line 80 changes from the H level to the L level, though not shown in FIG. 5. As a result, the timing signal TS is activated so that the sense amplifier SA starts to operate. At the time t7, the sense amplifier SA outputs the result Q (i.e., "YYY") of detecting data in the memory cell MC to which a read operation is to be performed.

At the time t11, the clock signal CLK changes from the H level to the L level. At this time, the voltage at the output terminal 80B of the delay line 80 stays on the H level without changing to the L level so that the internal clock signal CK1 is held on the H level.

Then, the voltage at the output terminal 80B changes from the H level to the L level so that, at the time t12, the internal clock signal CK1 changes from the H level to the L level. As a result of the changing of the internal clock signal CK1 to the L level, at the time t13, the control signal TDEC changes from the H level to the L level. As a result, the PMOS transistor P1 is turned ON, while the NMOS transistors N2 and N3 are turned OFF.

Subsequently, when the voltage at the output terminal 80B of the delay line 80 changes from the L level to the H level, the timing signal TS output from the inverter 66 to the sense amplifier SA changes from the H level to the L level, though not shown in FIG. 5. As a result, the sense amplifier SA stops operating.

Next, a description will be given of a transition to the resume standby mode (RS=1). At a time t21 in FIG. 14, the resume standby signal RS changes from the L level to the H level (i.e., the active state). As a result, at a time t22, the control signal ITE changes from the H level to the L level. When the control signal ITE changes to the L level, the NMOS transistor N1 is switched to the OFF state.

When the resume standby signal RS changes to the H level, the signal input to the gate of the NMOS transistor N4 changes to the L level. As a result, the NMOS transistor N4 is brought into the OFF state so that the ground wire LCVSS for the peripheral circuits is disconnected from the VSS power supply node. Consequently, the voltage on the ground wire LCVSS becomes the middle-level voltage between the power supply voltage VDD and the ground voltage VSS.

Effects of Fifth Embodiment

In the fifth embodiment, by using the resume standby signal RS which can be switched to the active state or the inactive state when the test mode signal TE is inactive, the NMOS transistor N1 can be controlled into the OFF state with timing which does not affect the operation of the semiconductor device 103. As a result, it is possible to allow the NMOS transistor N1 to recover from BTI degradation.

In addition, in the resume standby mode, the ground wire LCVSS for the peripheral circuits is disconnected from the VSS power supply node. Accordingly, the voltage on the ground wire LCVSS may be higher than the ground voltage VSS. As a result, between the gate and the source of the NMOS transistor N1, a reverse bias is applied, and therefore a higher effect of allowing recovery from BTI degradation can be expected.

Sixth Embodiment

Figure 15:
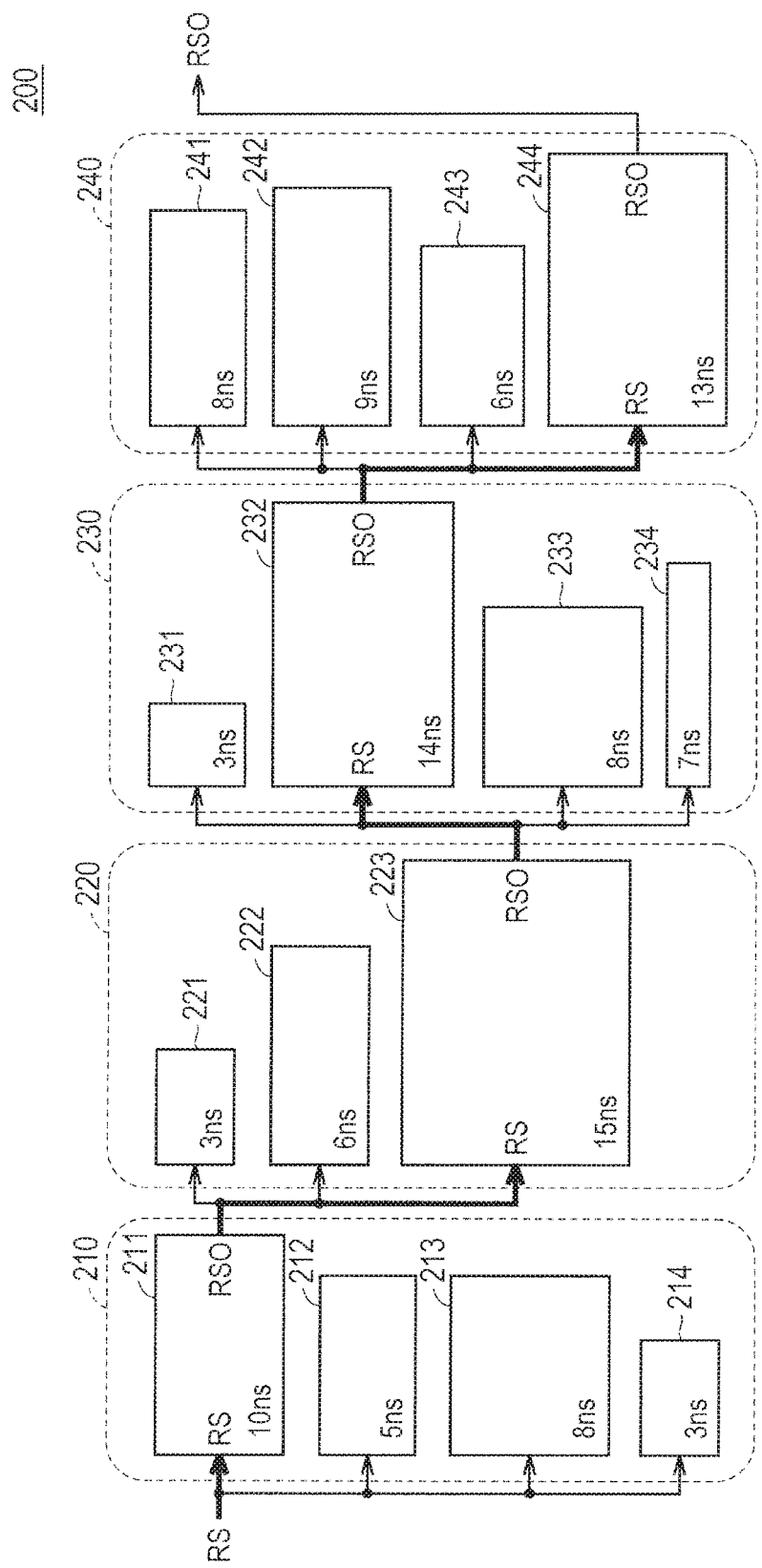
FIG. 15 is a block diagram showing a configuration of a semiconductor device according to a sixth embodiment.

FIG. 15 is a block diagram showing a configuration of a semiconductor device according to a sixth embodiment.

Referring to FIG. 15, a semiconductor device 200 includes a plurality of memory modules 211 to 214, 221 to 223, 231 to 234, and 241 to 244. Each of the memory modules has the configuration described using FIG. 11 or FIG. 13.

The plurality of memory modules are grouped and assigned to a plurality of memory blocks 210, 220, 230, and 240. Specifically, the memory block 210 includes the memory modules 211 to 214. The memory block 220 includes the memory modules 221 to 223. The memory block 230 includes the memory modules 231 to 234. The memory block 240 includes the memory modules 241 to 244.

In the configuration described above, a propagation path for the resume standby signal RS is configured as follows. Specifically, the resume standby signal RS sequentially propagates through the different memory blocks 210, 220, 230, and 240 in a chain-like manner. The resume standby signal RS propagates in parallel through the individual memory modules in the same memory block. The resume standby signal RS that has passed through the memory module having a largest memory capacity (i.e., having a large amount of propagation delay of the resume standby signal RS) among the individual memory modules in each of the memory blocks propagates to the memory block in the next stage.

The configuration described above can reduce an inrush current generated when the resume standby mode is cancelled. In addition, since the resume standby signal RS is caused to propagate through the memory module having the largest amount of propagation delay in each of the memory blocks, even when a transition to and a return from the resume standby mode are repeated, it is possible to ensure a sufficient time for recovery from the BTI degradation.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A semiconductor device, comprising:
a delay element;
a drive circuit which is coupled to the delay element, and controls a first circuit; and
a control circuit which controls the drive circuit,
wherein the drive circuit includes:
a first MOS transistor coupled between a first power supply node and the delay element;
a second MOS transistor having a first conductivity type which is coupled in series to the first MOS transistor, and coupled between the first power supply node and the delay element;
a third MOS transistor coupled in parallel to the first and second MOS transistors between the first power supply node and the delay element; and
a fourth MOS transistor coupled between a second power supply node and the delay element,
wherein the control circuit includes:
a first logic circuit that receives an operation mode signal and a clock signal, an output signal from the first logic circuit being input to the first MOS transistor; and
a second logic circuit which receives the clock signal, an output signal from the second logic circuit being input to the second MOS transistor,
wherein a threshold voltage of a fifth MOS transistor used in the first logic circuit is not more than a threshold voltage of a sixth MOS transistor used in the second logic circuit,
wherein, when the operation mode signal is inactive and the clock signal is inactive, the control circuit controls the second MOS transistor into an OFF state and controls the first MOS transistor into the OFF state at least temporarily.

2. The semiconductor device according to claim 1,
wherein each of the first, second, and third MOS transistors has the first conductivity type, and
wherein the fourth MOS transistor has a second conductivity type.

3. The semiconductor device according to claim 1,
wherein, when the operation mode signal is active, the control circuit controls the first MOS transistor into an OFF state, and
wherein, when the operation mode signal is inactive and a clock signal is active, the control circuit controls the first and second MOS transistors into an ON state.

4. The semiconductor device according to claim 1,
wherein the third MOS transistor has a first conductivity type, and
wherein, irrespective of whether or not the operation mode signal is active, the control circuit controls the third MOS transistor into an ON state when the clock signal is active and controls the third MOS transistor into the OFF state when the clock signal is inactive.

5. The semiconductor device according to claim 4, wherein, irrespective of whether or not the operation mode signal is active, the control circuit controls the fourth MOS transistor into the OFF state when the clock signal is active and controls the fourth MOS transistor into the ON state when the clock signal is inactive.

6. The semiconductor device according to claim 1, further comprising:
   a memory cell array; and
   a sense amplifier which detects data stored in the memory cell array,
   wherein the delay element includes a delay line,
   wherein the second, third, and fourth MOS transistors are coupled to an input terminal of the delay line, and
   wherein the sense amplifier starts to operate when a signal at an output terminal of the delay line is activated.

7. The semiconductor device according to claim 6, wherein the first logic circuit further receives a signal from the input terminal of the delay line.

8. The semiconductor device according to claim 7,
   wherein, when the operation mode signal is active, the first logic circuit outputs a signal which turns OFF the first MOS transistor to a gate of the first MOS transistor, and
   wherein, when the operation mode signal is inactive, the clock signal is inactive, and the signal from an input terminal of the drive circuit is active, the first logic circuit outputs the signal which turns OFF the first MOS transistor to the gate of the first MOS transistor.

9. The semiconductor device according to claim 1, wherein a gate width of a fifth MOS transistor used in the first logic circuit is not less than a gate width of a sixth MOS transistor used in the second logic circuit.

* * * * *